United States Patent
Tanaka

(10) Patent No.: US 10,483,348 B2
(45) Date of Patent: Nov. 19, 2019

(54) SEMICONDUCTOR DEVICE

(71) Applicant: SOCIONEXT, INC., Kanagawa (JP)

(72) Inventor: Hidetoshi Tanaka, Aichi (JP)

(73) Assignee: SOCIONEXT, INC., Kanagawa (JP)

( * ) Notice: Subject to any disclaimer, the term of this patent is extended or adjusted under 35 U.S.C. 154(b) by 0 days.

(21) Appl. No.: 15/982,775

(22) Filed: May 17, 2018

(65) Prior Publication Data
US 2018/0342575 A1   Nov. 29, 2018

(30) Foreign Application Priority Data

May 25, 2017   (JP) .................................. 2017-103566

(51) Int. Cl.
| | |
|---|---|
| *H01L 31/113* | (2006.01) |
| *H01L 31/119* | (2006.01) |
| *H01L 29/06* | (2006.01) |
| *H01L 27/02* | (2006.01) |
| *H01L 29/786* | (2006.01) |
| *H01L 29/78* | (2006.01) |

(52) U.S. Cl.
CPC ...... *H01L 29/0619* (2013.01); *H01L 27/0266* (2013.01); *H01L 29/785* (2013.01); *H01L 29/78696* (2013.01)

(58) Field of Classification Search
CPC ............. H01L 29/7811; H01L 29/7823; H01L 29/0619
See application file for complete search history.

(56) References Cited

U.S. PATENT DOCUMENTS

| | | | |
|---|---|---|---|
| 9,978,751 B2 * | 5/2018 | Wang | .................. H01L 27/0924 |
| 2010/0276762 A1 * | 11/2010 | Hayashi | .............. H01L 23/5225 |
| | | | 257/409 |
| 2012/0038003 A1 | 2/2012 | Kawachi | |
| 2014/0217510 A1 | 8/2014 | Koyama et al. | |

FOREIGN PATENT DOCUMENTS

| | | |
|---|---|---|
| JP | 2012-043845 A | 3/2012 |
| JP | 2014-154595 A | 8/2014 |

* cited by examiner

*Primary Examiner* — Hsien Ming Lee
(74) *Attorney, Agent, or Firm* — McDermott Will & Emery LLP

(57) ABSTRACT

A semiconductor device has transistors formed on a substrate and including first and second impurity regions of a first conductivity type, a guard ring of a second conductivity type formed on the substrate and surrounding the transistors in a plan view, a wiring formed on and electrically connected to the guard ring, and a ground wiring faulted on the wiring and electrically connected to the wiring and the second impurity region. In a plan view, the transistor includes a first part having a distance that is a first distance from the guard ring, and a second part having a distance that is a second distance shorter than the first distance from the guard ring. In a plan view, the first part is located at a position separated from the ground wiring, and the second part is located at a position overlapping the ground wiring.

20 Claims, 28 Drawing Sheets

SEMICONDUCTOR DEVICE

CROSS-REFERENCE TO RELATED APPLICATIONS

This application is based upon and claims the benefit of priority of the prior Japanese Patent Application No. 2017-103566 filed on May 25, 2017, the entire contents of which are incorporated herein by reference.

BACKGROUND OF THE INVENTION

1. Field of the Invention

The present invention relates to a semiconductor device.

2. Description of the Related Art

In semiconductor devices, it is known to provide an ESD (Electro Static Discharge) protection circuit between a power supply terminal (VDD) and a ground terminal (VSS).

For example, the semiconductor device may be provided with the ESD protection circuit that is surrounded by a guard ring connected to a ground wiring, as proposed in Japanese Laid-Open Patent Publications No. 2012-043845 and No. 2014-154595, for example.

Due to recent size reduction of the semiconductor devices, deteriorated reliability of metal wirings caused by EM (Electro-Migration) is becoming a problem. Because the EM is a phenomenon that occurs when a current flows through the metal wiring, the EM may be generated in the metal wiring when an ESD current flows through the metal wiring. However, the existing semiconductor devices provided with the ESD protection circuit do not take into consideration the generation of EM.

SUMMARY OF THE INVENTION

Accordingly, it is an object in one aspect of the embodiments to provide a semiconductor device provided with an ESD protection circuit and capable of reducing generation of EM.

According to one aspect of embodiments of the present invention, a semiconductor device includes a substrate; a first transistor which includes a first impurity region of a first conductivity type formed in the substrate, and which includes a second impurity region of the first conductivity type formed in the substrate; a first guard ring of a second conductivity type different from the first conductivity type, formed in the substrate, the first guard ring surrounding the first transistor in a plan view; a first wiring formed on the first guard ring and electrically connected to the first guard ring; and a ground wiring formed on the first wiring, the ground wiring being electrically connected to the first wiring and the second impurity region, wherein the first transistor includes a first part and a second part, the first part of the first transistor is separated with a first distance from the first guard ring in a plan view, the second part of the first transistor is separated with a second distance from the first guard ring in a plan view, the second distance is shorter than the first distance, the first part is separated from the ground wiring in a plan view, and the second part is overlapped with the ground wiring in a plan view.

According to another aspect of embodiments of the present invention, a semiconductor device includes a substrate; a second transistor, which includes a third impurity region of the second conductivity type formed in the substrate, and which includes a fourth impurity region of the second conductivity type formed in the substrate; a second guard ring of the first conductivity type formed in the substrate, the second guard ring surrounding the second transistor in a plan view; a second wiring formed on the second guard ring and electrically connected to the second guard ring; and a power supply wiring formed on the second wiring, the power supply wiring being electrically connected to the second wiring and the third impurity region, wherein the second transistor includes a fourth part and a fifth part, the fourth part of the second transistor is separated with a fourth distance from the second guard ring in a plan view, the fifth part of the second transistor is separated with a fifth distance from the second guard ring in a plan view, the fifth distance is shorter than the fourth distance, the fourth part is separated from the power supply wiring in a plan view, and the fifth part is overlapped with the power supply wiring in a plan view.

Other objects and further features of the present invention may be apparent from the following detailed description when read in conjunction with the accompanying drawings.

BRIEF DESCRIPTION OF THE DRAWINGS

FIG. 15 is a diagram for explaining an arrangement of a VDD wiring, a VSS wiring, or the like;

DESCRIPTION OF THE PREFERRED EMBODIMENTS

Figure 1:
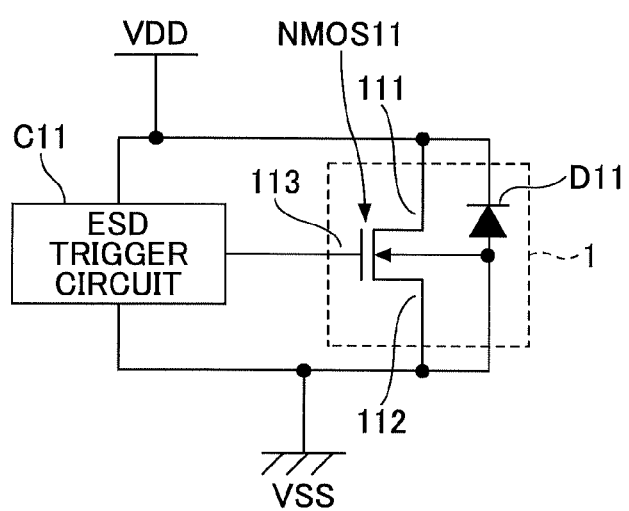
FIG. 1 is a circuit diagram of a semiconductor device in a first embodiment.

Embodiments and modifications will be described with reference to the drawings. In the drawings, constituent elements that are the same are designated by the same reference numerals, and a description of the same reference numerals may be omitted. In this specification a first conductivity type refers to an N-type of a P-type, and a second conductivity type refers to the P-type or the N-type that is a conductivity type opposite to the first conductivity type.

[First Embodiment]

FIG. 1 is a circuit diagram of a semiconductor device in a first embodiment. As illustrated in FIG. 1, a semiconductor device 1 includes an NMOS 11 which is an N-channel MOSFET (Metal-Oxide-Semiconductor Field-Effect-Transistor). The NMOS 11 is an example of a first transistor. The NMOS 11 is connected between a power supply terminal VDD and a ground terminal VSS. An ESD trigger circuit C11 is connected to a gate electrode 113 of the NMOS 11. A reference numeral D11 denotes a parasitic diode.

The ESD trigger circuit C11 detects an ESD surge, and turns on the NMOS 11 within a surge generation time. Hence, it is possible to protect a protected circuit, that is connected between the power supply terminal VDD and the ground terminal VSS, from the ESD surge. The protected circuit may be all of the circuits connected between the power supply terminal VDD and the ground terminal VSS.

In the first embodiment, a case is described in which the semiconductor device 1 includes planar FETs.

Figure 2:
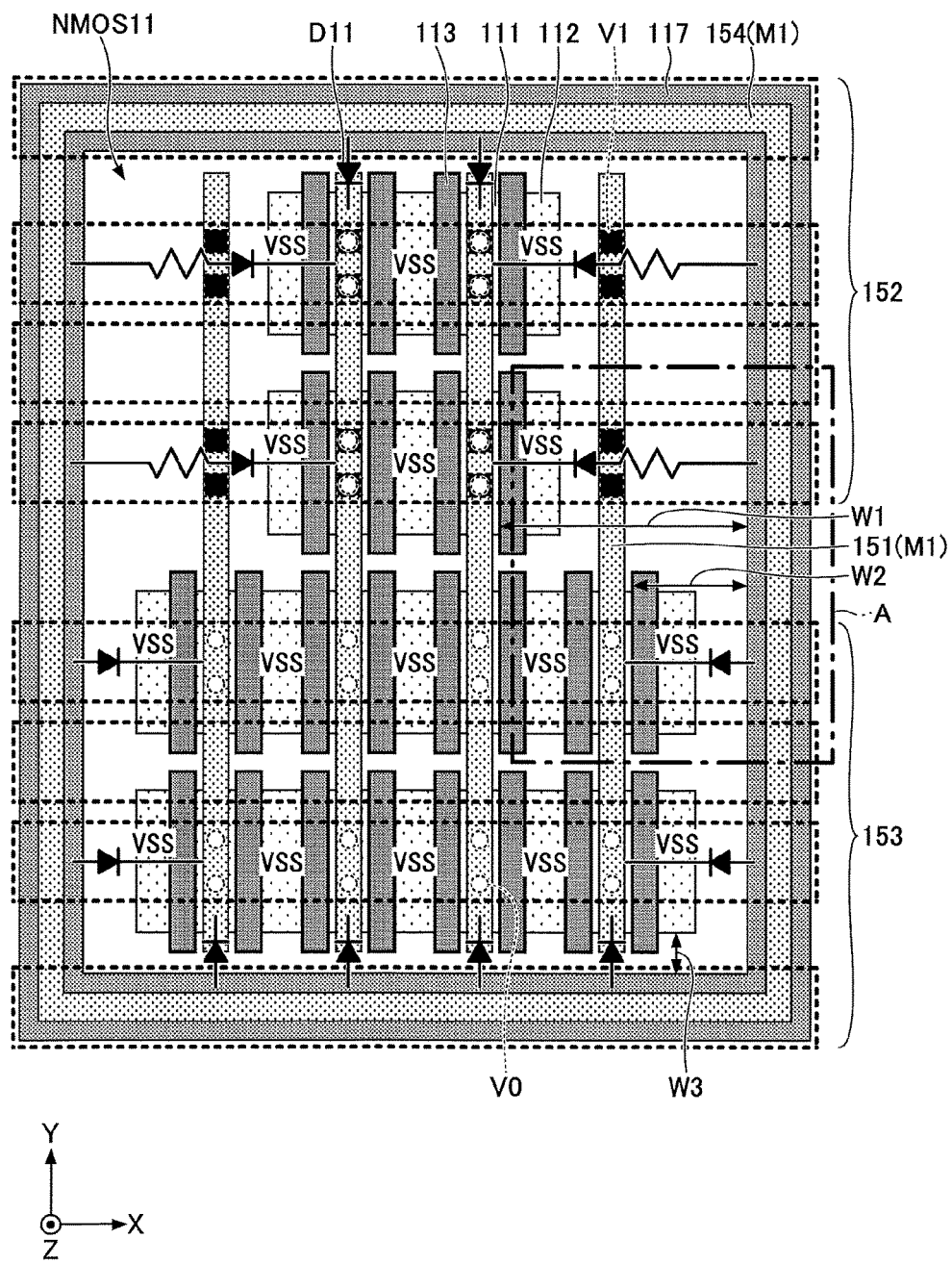
FIG. 2 is a plan view illustrating an example of a structure of the semiconductor device in the first embodiment.

FIG. 2 is a plan view illustrating an example of a structure of the semiconductor device in the first embodiment.

As illustrated in FIG. 1 and FIG. 2, in the semiconductor device 1, a first impurity region 111 of the N-type, in the NMOS 11, is electrically connected to the power supply terminal VDD via a power supply wiring (hereinafter also referred to as "VDD wiring") 152. In addition, a second impurity region 112 of the N-type, in the NMOS 11, is electrically connected to the ground terminal VSS via a ground wiring (hereinafter also referred to as "VSS wiring") 153. Further, the impurity regions 111 of the NMOSs 11 that are arranged in a Y-direction are electrically connected to wirings 151.

The impurity regions 111 and 112 and the gate electrode 113 of a plurality of NMOSs 11 are surrounded by a guard ring 117 in a plan view. The guard ring 117 is an example of a first guard ring, and is formed by a P-type impurity region. The guard ring 117 is connected to the VSS wirings 153 through a wiring 154 of a metal wiring layer M1 that is arranged on the guard ring 117. In addition, the wiring 154 is arranged to surround the NMOSs 11 in a plan view.

In FIG. 2, the illustration of vias V0 arranged on the guard ring 117, a wiring of a wiring layer M1 electrically connecting a plurality of impurity regions 112, and a wiring of the wiring layer M1 electrically connecting a plurality of gate electrodes 113 is omitted.

In this specification, a "guard ring" refers to an impurity region formed on the substrate, that surrounds one or more transistors, or a circuit. In cases described later in which a Fin FET or a nanowire FET is used, the "guard ring" may refer to an impurity region that intermittently or discontinuously surrounds the one or more transistors, or the circuit. Further, a plan view of the semiconductor device or parts thereof refers to a view from above the semiconductor device or parts thereof in a direction perpendicular to a substrate surface on which various layers of the semiconductor device are formed.

In the semiconductor device 1, a distance W2 or W3 between a first part of the guard ring 117 under the VSS wiring 153, and the impurity region 111 of the NMOS 11 is shorter than a distance W1 between a second part of the guard ring 117 other than the first part, and the impurity region 111 of the NMOS 11.

When it is assumed that the ESD current flows from the ground terminal VSS to the power supply terminal VDD in a structure in which no difference is provided between the distance W1 and the distance W2 or W3, the ESD current, after flowing through a part under the VSS wiring 153, reaches the power supply terminal VDD through the wiring 154 of the metal wiring layer M1. For this reason, EM may be generated in the wiring 154.

On the other hand, in the semiconductor device 1, the distance W2 or W3 is shorter than the distance W1. Hence, the ESD current more easily flows through the part at the distance W2 or W3 having a low resistance, than through the part at the distance W1 having a high resistance. Consequently, it is possible to reduce the ESD current flowing through the wiring 154 on the guard ring 117, to thereby reduce the EM from being generated in the wiring 154 due to the ESD current.

FIG. 2 illustrates an example in which the NMOSs 11 are arranged in four stages in the Y-direction inside the guard ring 117. However, the number of stages of the NMOSs 11 arranged in the Y-direction inside the guard ring 117 is not limited to four stages.

Figure 3:
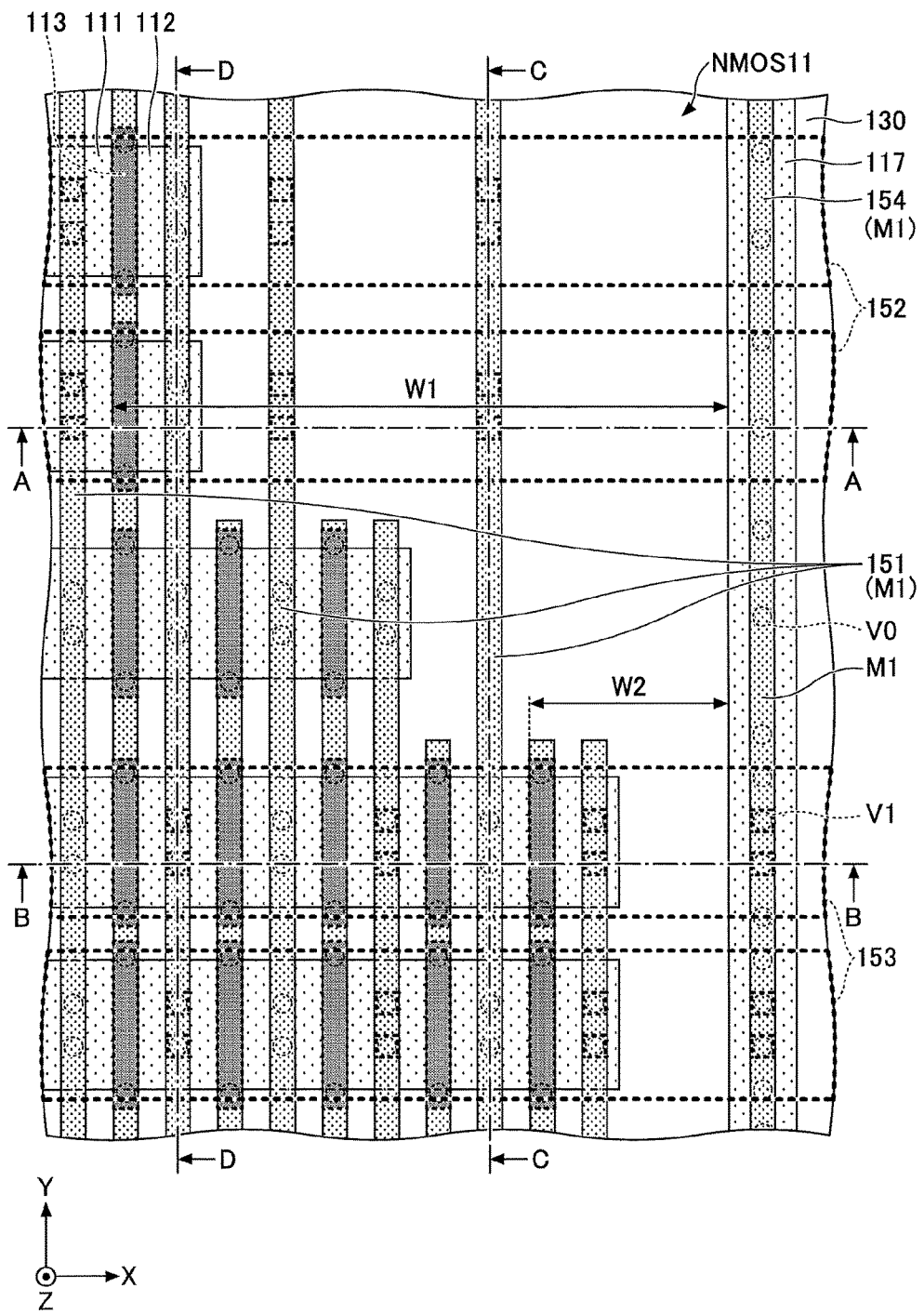
FIG. 3 is a plan view of a part A in FIG. 2.
Figure 4:
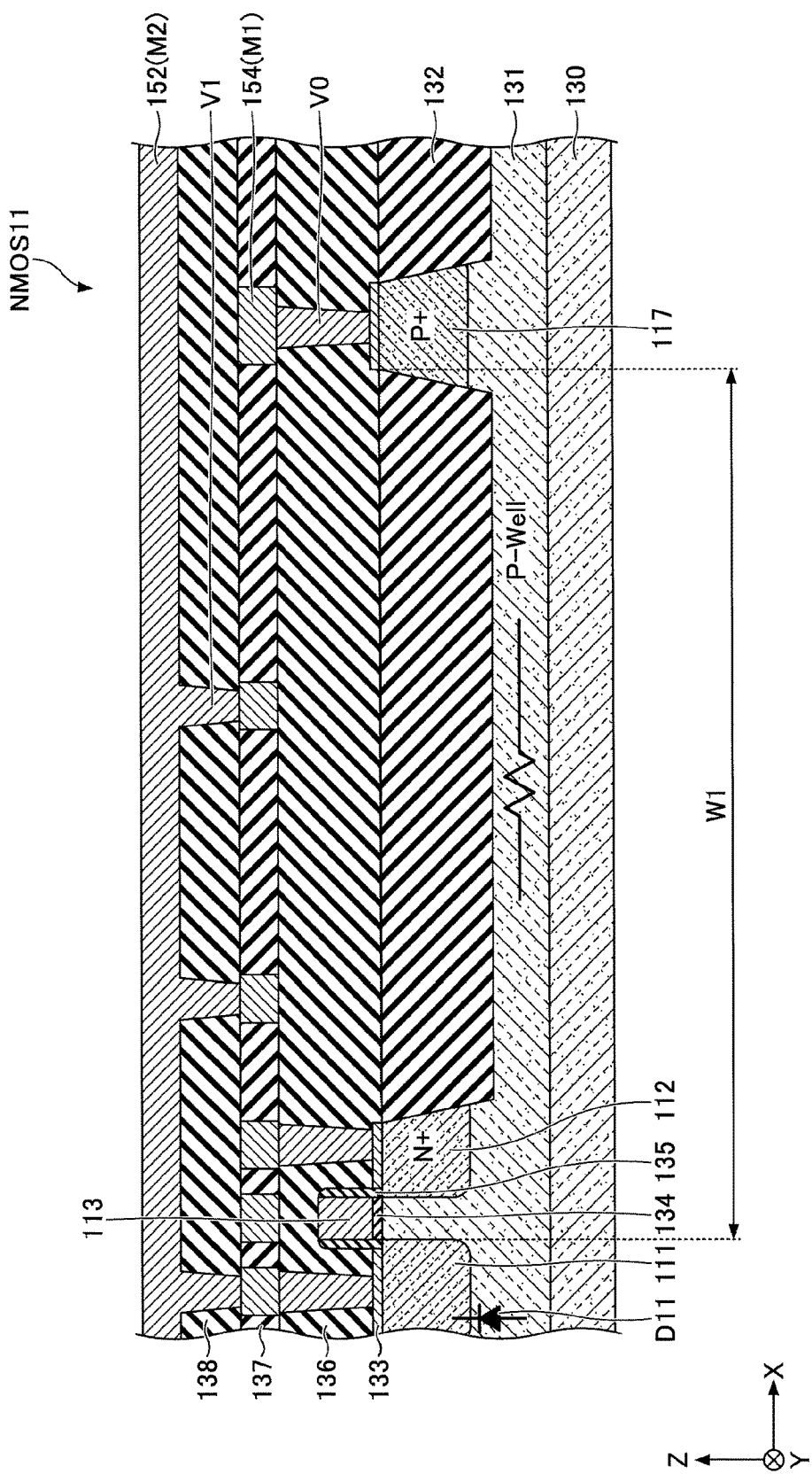
FIG. 4 is a cross sectional view along a line A-A in FIG. 3.
Figure 5:
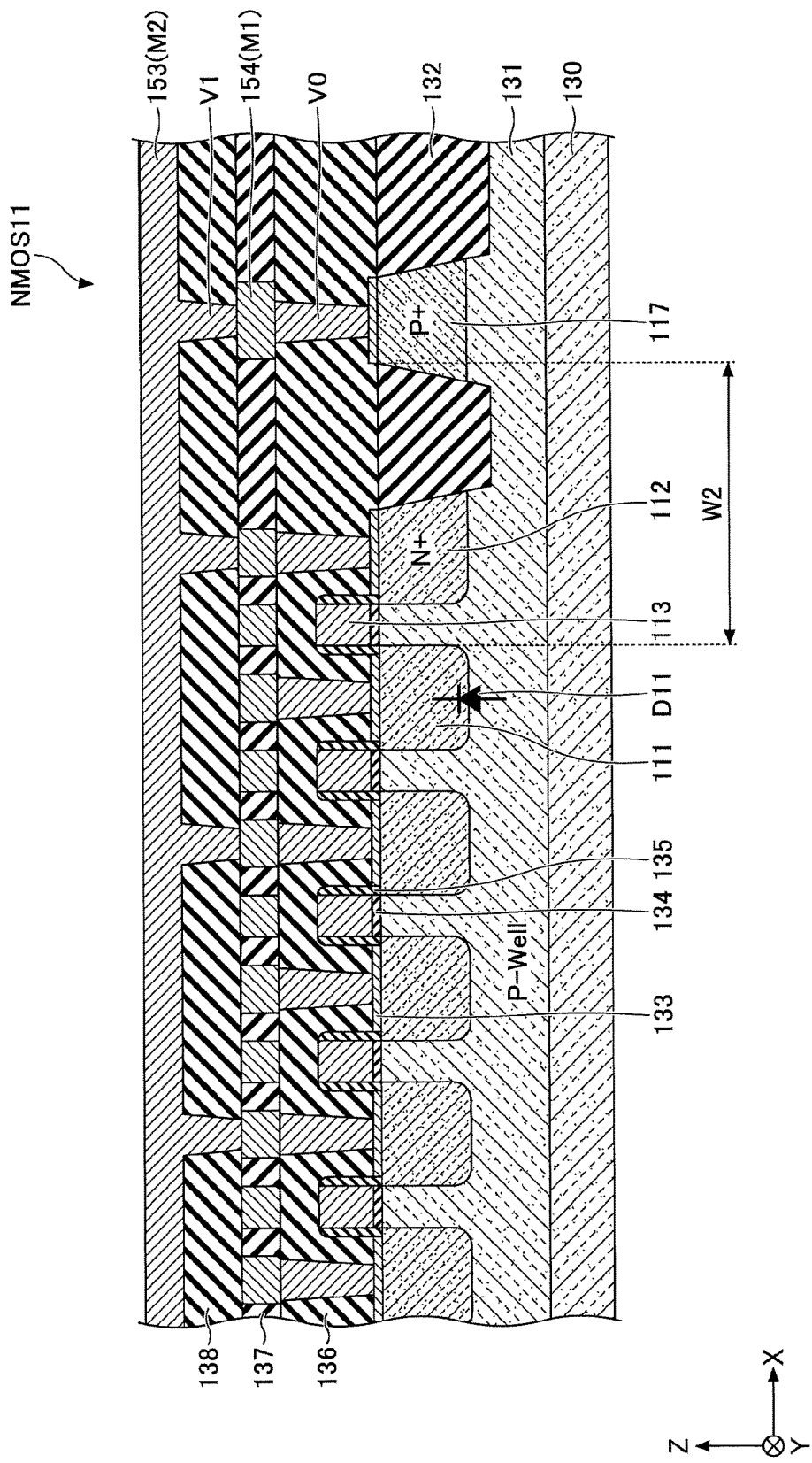
FIG. 5 is a cross sectional view along a line B-B in FIG. 3.
Figure 6:
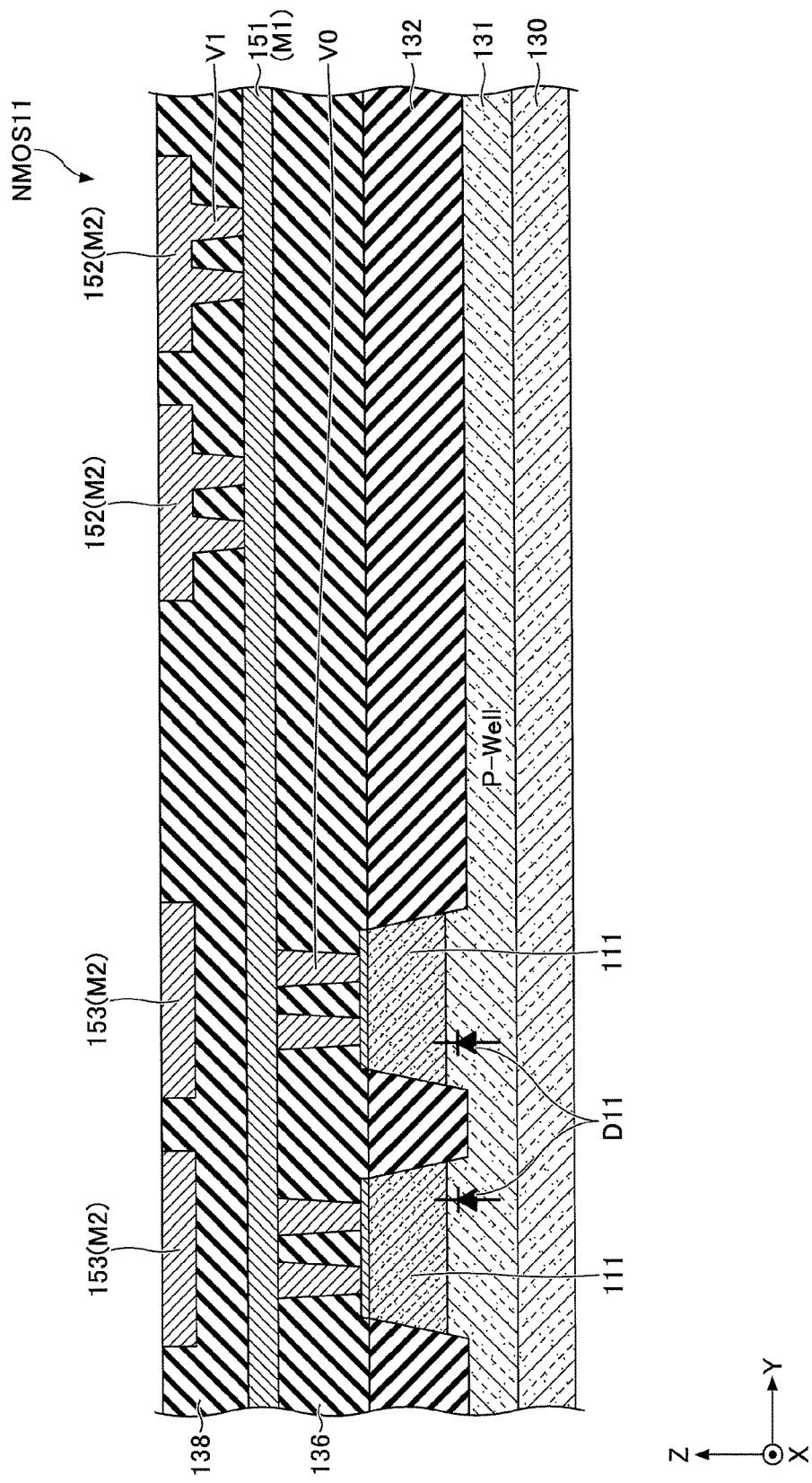
FIG. 6 is a cross sectional view along a line C-C in FIG. 3.
Figure 7:
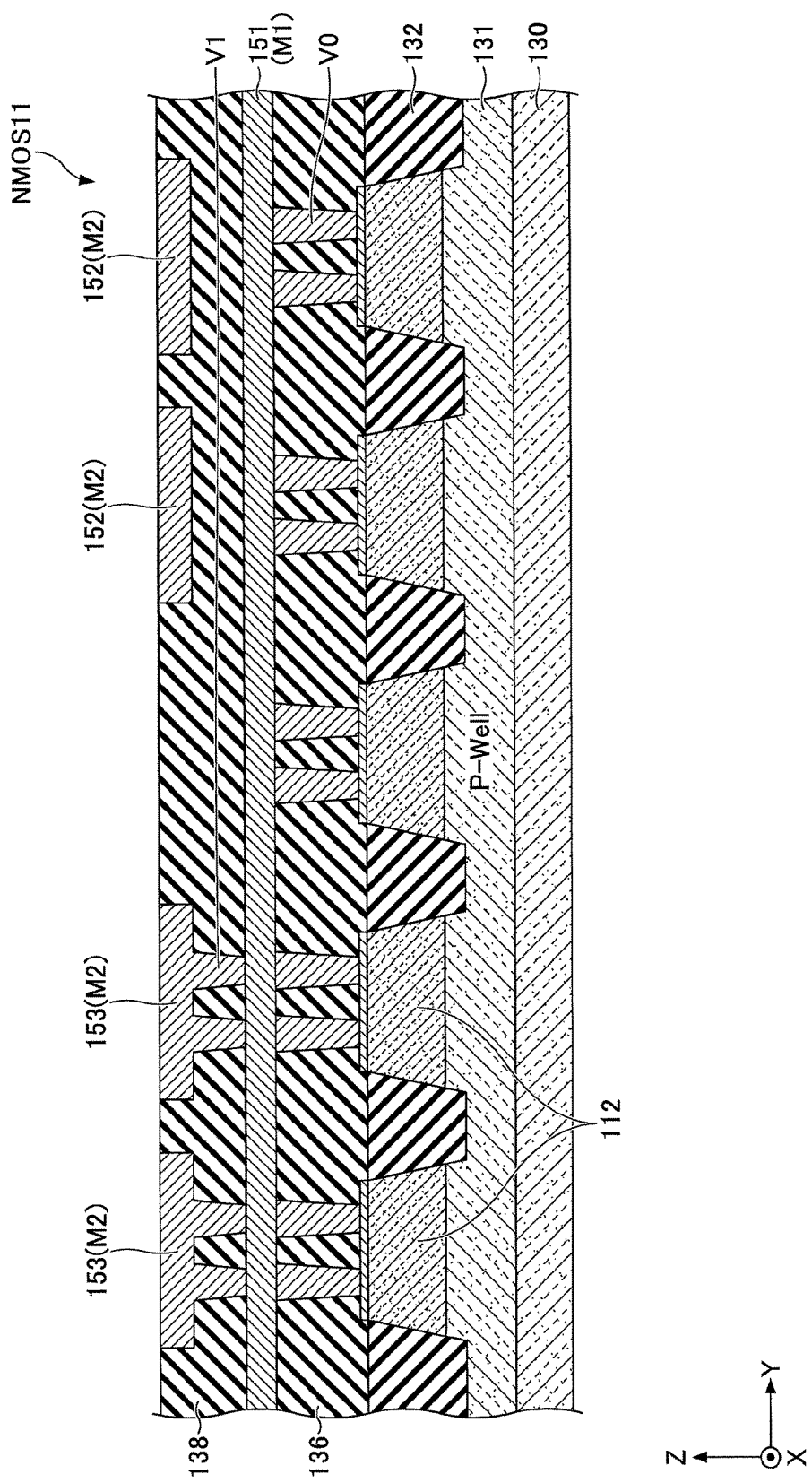
FIG. 7 is a cross sectional view along a line D-D in FIG. 3.

Next, a more detailed description will be given of a layout of the semiconductor device 1. FIG. 3 is a plan view of a part A in FIG. 2. FIG. 4 is a cross sectional view along a line A-A in FIG. 3. FIG. 5 is a cross sectional view along a line B-B in FIG. 3. FIG. 6 is a cross sectional view along a line C-C in FIG. 3. FIG. 7 is a cross sectional view along a line D-D in FIG. 3.

As illustrated in FIG. 3 through FIG. 7, a P-well 131 including a P-type impurity, STI (Shallow Trench Isolation) 132, the N-type first impurity region 111, the N-type second impurity region 112, the P-type guard ring 117, or the like are formed on a substrate 130 of the semiconductor device 1. The substrate 130 is made of an N-type semiconductor. The wiring 154 is formed on the guard ring 117. The wiring 154 is connected to the guard ring 117 through the vias V0. In a case in which the substrate 130 is made of a P-type semiconductor, the formation of the P-well 131 may be omitted.

A silicide layer 133 made of nickel-silicide, cobalt-silicide, or the like, for example, is foamed on surfaces of the first impurity regions 111 and the second impurity regions 112, and the guard ring 117. The STI 132 is foamed by a silicon oxide layer, for example. In FIG. 4 through FIG. 7, "P+" indicates a region having a higher P-type impurity concentration than the P-well, and "N+" indicates a region having a higher N-type impurity concentration than a N-well.

In a region between the first impurity region 111 and the second impurity region 112 on the substrate 130, a gate electrode 113 is foamed through a gate insulator layer 134. The gate electrode 113 may be formed by polysilicon, for example. The gate electrode 113 may be formed by a metal, such as titanium nitride, or the like. The gate insulator layer 134 may be formed by a silicon oxide layer, for example. The gate insulator layer 134 may be include an oxide of any of hafnium, zirconium, lanthanum, yttrium, aluminum, titanium, and tantalum.

A spacer layer 135 made of a silicon oxide layer, a silicon nitride layer, or the like, for example, is provided on side surfaces of the gate insulator layer 134 and the gate electrode 113. The silicide layer 133, the spacer layers 135, and the gate electrode 113 are covered by an interlayer insulator 136.

The metal wiring layer M1 is connected to the first impurity regions 111 and the second impurity regions 112, the guard ring 117, or the like through the vias V0 provided in the interlayer insulator 136. Side surfaces of the metal wiring layer M1 are covered by an interlayer insulator 137. A top surface of the metal wiring layer M1 is covered by an interlayer insulator 138.

A metal wiring layer M2 is connected to the metal wiring layer M1 through vias V1 provided in the interlayer insulator 138. Side surfaces of the metal wiring layer M2 are covered by the interlayer insulator 138.

The metal wiring layers M1 and M2, and the vias V1 may be formed by a barrier metal layer of tantalum or tantalum nitride, copper, or the like, for example. The vias V0 may be formed by a glue layer of titanium nitride, a tungsten layer, or the like, for example. The metal wiring layer M1 may have a single damascene structure, for example. The metal wiring layer M2 and the vias V1 may have a dual damascene structure, for example.

The interlayer insulator 136 may be formed by a silicon oxide layer, or the like, for example. The interlayer insulators 137 and 138 may be formed by a low dielectric constant material (or low-k material) such as SiOC (carbon-doped silicon oxide), a porous layer, or the like, for example.

The wiring 154 may be included in the metal wiring layer M1. The VDD wirings 152 and the VSS wirings 153 may be included in the metal wiring layer M2. A more detailed description will be given in conjunction with FIG. 3 through FIG. 7.

As illustrated in FIG. 3, the distance between the guard ring 117 under the VSS wiring 153, and the first impurity region 111 of the NMOS 11 is W2. The distance between other parts of the guard ring 117, and the first impurity region 111 of the NMOS 11 is W1 which is longer than the distance W2.

In addition, a density of the vias V0 located at positions overlapping the VSS wiring 153 in a plan view, along a direction (Y-direction in FIG. 3) in which the guard ring 117 extends, may be higher than a density of the vias V0 located at positions separated from and not overlapping the VSS wiring 153 in a plan view, along the direction in which the guard ring 117 extends. In this case, it is possible to cause the ESD current to more easily flow to the guard ring 117 under the VSS wiring 153. However, the density of the vias V0 located at the positions overlapping the VSS wiring 153 in a plan view, along the direction in which the guard ring 117 extends, may be the same as the density of the vias V0 located at the positions separated from and not overlapping the VSS wiring 153 in a plan view, along the direction in which the guard ring 117 extends. The "density" of the vias V0 refers to the number of vias V0 that are arranged in a predetermined direction in a plan view per unit length.

As illustrated in FIG. 3, the distance between the guard ring 117 and the NMOS 11 may be increased in steps as a distance from the VSS wiring 153 increases. In other words, the distance between the guard ring 117 and the NMOS 11 may be increased in steps, from the part of the NMOS 11 which is separated with the shorter distance W2 from the guard ring 117, to the part of the NMOS 11 which is separated with the longer distance W1 from the guard ring 117.

By employing such an arrangement, it is possible to increase the number of NMOSs 11 inside the guard ring 117 while obtaining the effect of reducing the EM. As a result, it is possible to improve the performance of the semiconductor device 1, such as a driving capability of the semiconductor device 1, a protection capability against the ESD surge with respect to the protected circuit, or the like, for example.

As illustrated in FIG. 3, one of the wirings 151 may connect to the impurity regions 111 at positions overlapping the VSS wirings 153 in a plan view, and connect to the VDD wirings 152 at positions separated from and not overlapping the impurity regions 111 in a plan view. For example, the position separated from and not overlapping the impurity region 111 in a plan view is a position on the STI 132 between the guard ring 117 and the impurity region 112.

Although FIG. 3 illustrates a right part of FIG. 2 on an enlarged scale, a left part of FIG. 2 may have a structure similar to the structure illustrated in FIG. 3.

FIG. 3 illustrates the wirings of the wiring layer M1 extending in the Y-direction, electrically connecting the impurity regions 112 and the VSS wirings 153, and mutually electrically connecting the plurality of impurity regions 112. FIG. 3 also illustrates the wirings of the wiring layer M1 extending in the Y-direction, mutually electrically connecting the plurality of gate electrodes 113.

Because the distance W1 is longer than the distance W2, as illustrated in FIG. 4 and FIG. 5, a resistance of the P-well 131 under the STI 132 (in a region above a double-sided pointed arrow indicating the distance W1) illustrated in FIG. 4 becomes higher than a resistance of the P-well 131 under the STI 132 (in a region above a double-sided pointed arrow indicating the distance W2) illustrated in FIG. 5. A graphical symbol of a resistor is illustrated in the P-well 131 illustrated in FIG. 4 to schematically indicate that the resistance is high, and the same graphical symbol is used for the schematic illustration in other figures, where appropriate.

As illustrated in FIG. 6 and FIG. 7, the wirings 151 of the metal wiring layer M1 connect to the impurity regions 111 of the NMOSs 11 through the vias V0. In addition, the wirings 151 extend in the Y-direction to traverse the STI 132 in the regions in which no NMOSs 11 are arranged, from under the VSS wirings 153 to under the VDD wirings 152, to connect to the VDD wirings 152 through the vias V1.

In FIG. 4 through FIG. 7, the VDD wirings 152 and the VSS wirings 153 are arranged in the metal wiring layer M2. However, the VDD wirings 152 and the VSS wirings 153 may be arranged in a metal wiring layer above the metal wiring layer M2.

Accordingly, in the semiconductor device 1 in the first embodiment, the part, which is separated with longer distance (the distance W1) from the guard ring 117 in a plan view, is located at the position separated from (non-overlapping) the VSS wiring 153 in a plan view. And the part, which is separated with shorter distance (the distance W2 or W3) from the guard ring 117 in a plan view, is located at the position overlapping the VSS wiring 153 in a plan view. Hence, the ESD current more easily flows through the part having the distance W2 or W3 and the low resistance, than the part having the distance W1 and the high resistance. As a result, it is possible to reduce the ESD current flowing through the wiring 154 on the guard ring 117, to thereby reduce the EM from being generated in the wiring 154 due to the ESD current.

Further, the density of the vias V0 located at the positions overlapping the VSS wiring 153 in a plan view, along the direction (Y-direction in FIG. 3) in which the guard ring 117 extends, may be higher than the density of the vias V0 located at the non-overlapping positions not overlapping the VSS wiring 153 in a plan view, along the direction in which the guard ring 117 extends. In this case, it is possible to cause the ESD current to more easily flow to the guard ring 117 under the VSS wiring 153, to thereby further reduce the EM from being generated in the wiring 154 due to the ESD current.

The distance between the guard ring 117 and the NMOS 11 may be increased in steps as the distance from the VSS wiring 153 increases. By employing such an arrangement, it is possible to increase the number of NMOSs 11 inside the guard ring 117 while obtaining the effect of reducing the EM, and improve the performance of the semiconductor device 1, such as the driving capability of the semiconductor device 1, the protection capability against the ESD surge with respect to the protected circuit, or the like, for example.

In this embodiment, the NMOSs 11 are provided between the ground terminal VSS and the power supply terminal VDD. However, the NMOSs 11 may be provided between the ground terminal VSS and an input and output terminal (or pad), in place of the power supply terminal VDD.

[First Modification of First Embodiment]

A first modification of the first embodiment illustrates an example in which the semiconductor device 1 includes Fin FETs, namely, FETs including fin-shaped channels. In the first modification of the first embodiment, a description of the same constituent elements that have been described above may be omitted.

Figure 8:
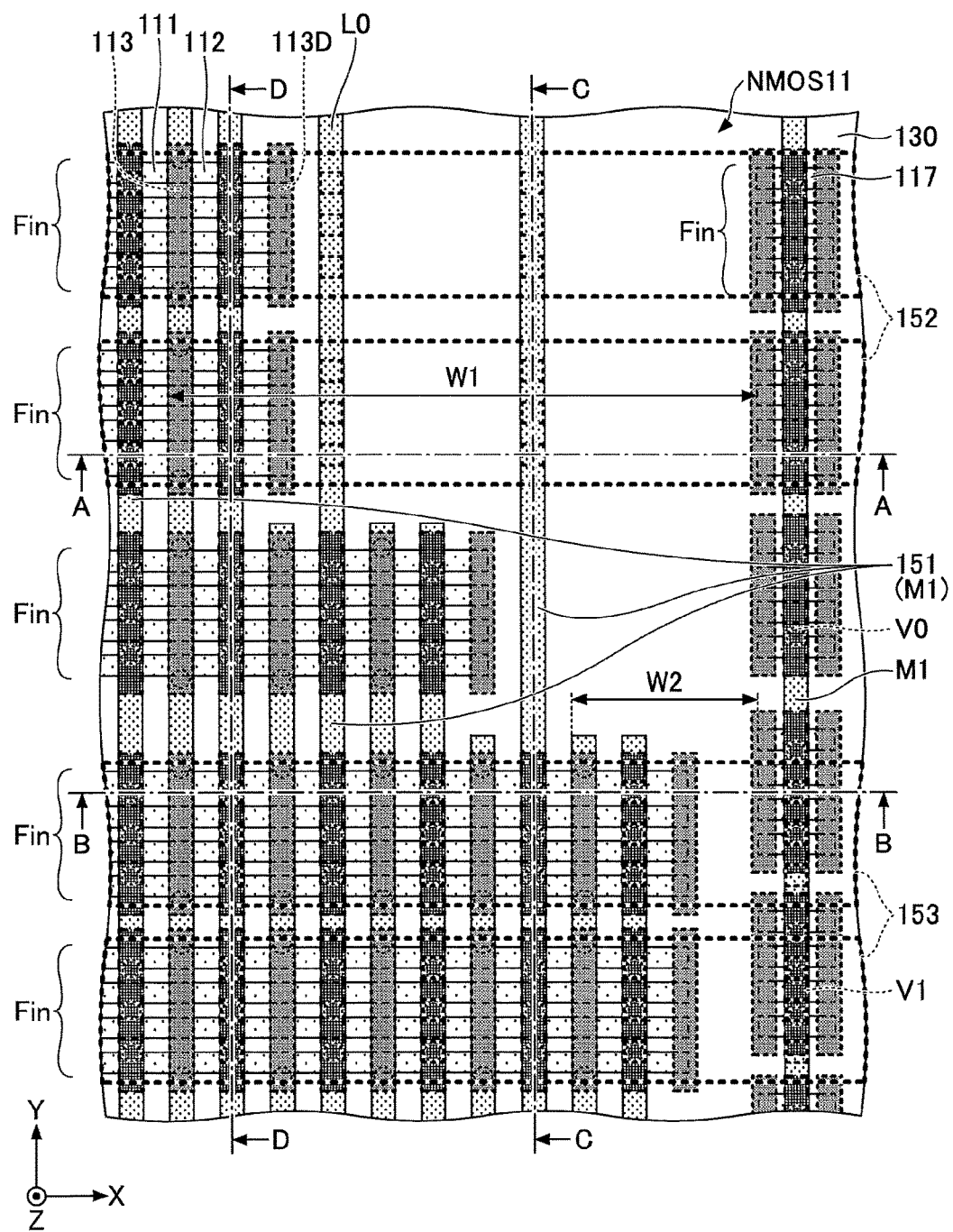
FIG. 8 is a plan view, corresponding to FIG. 3, illustrating the semiconductor device in a first modification of the first embodiment.
Figure 9:
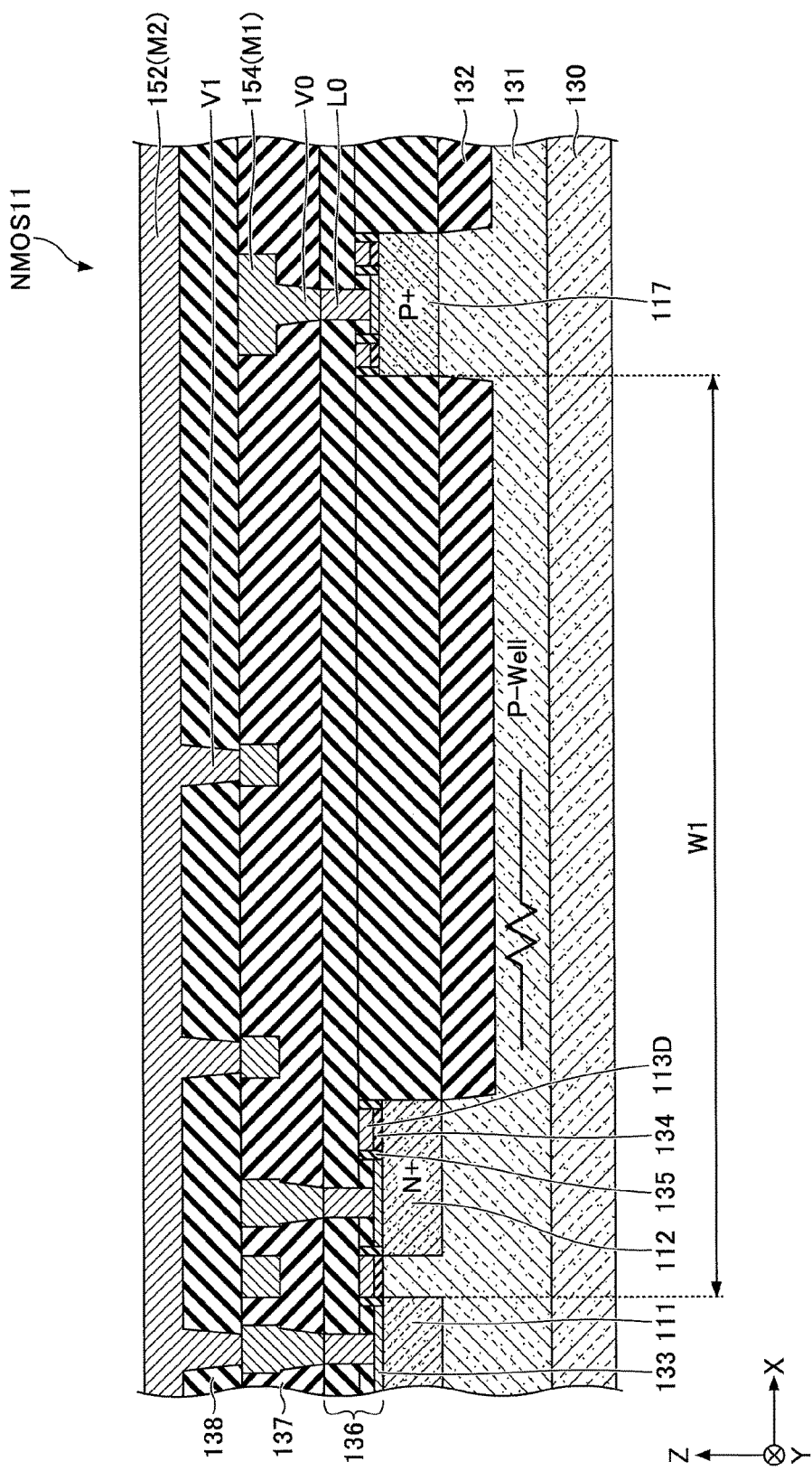
FIG. 9 is a cross sectional view along a line A-A in FIG. 8.
Figure 10:
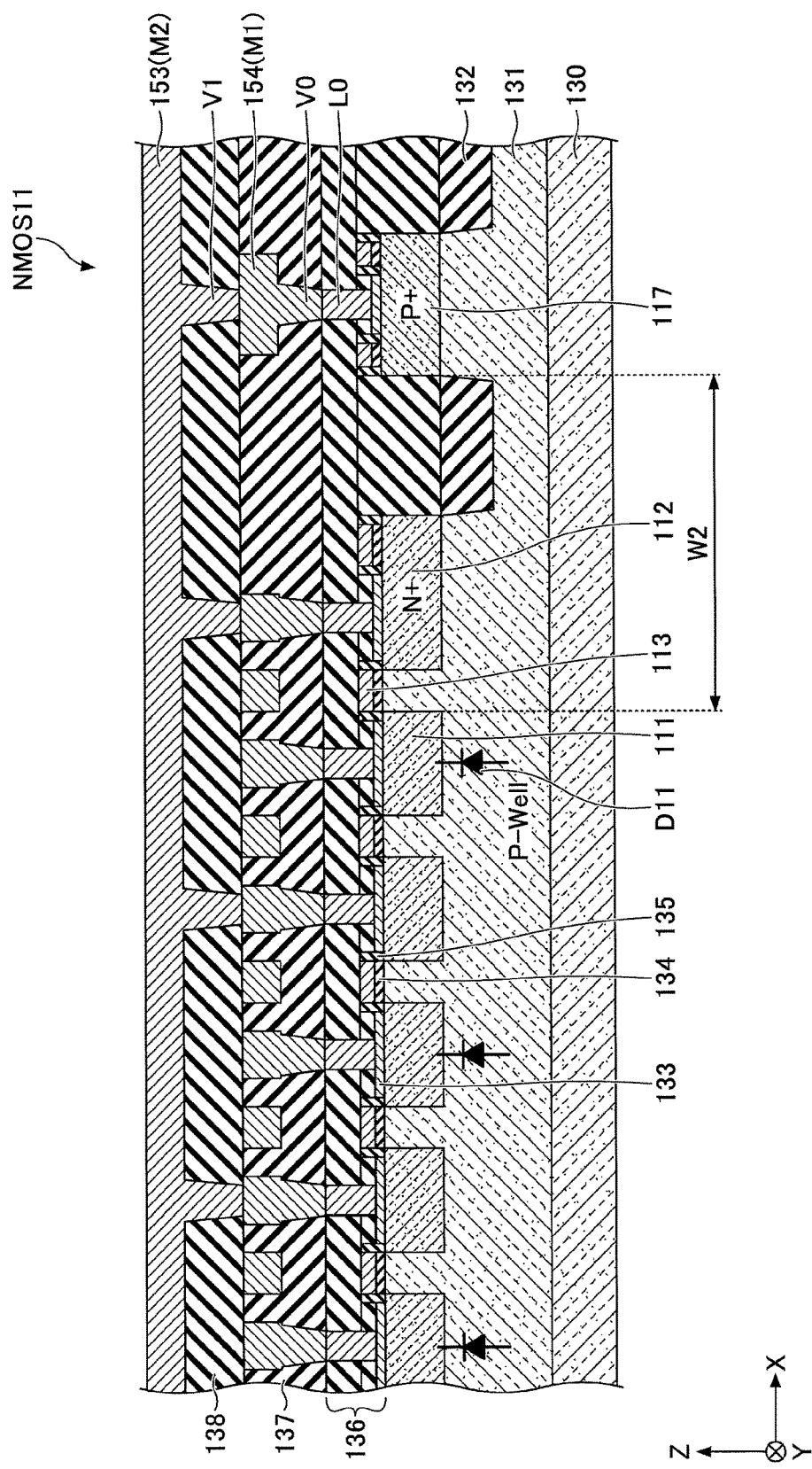
FIG. 10 is a cross sectional view along a line B-B in FIG. 8.
Figure 11:
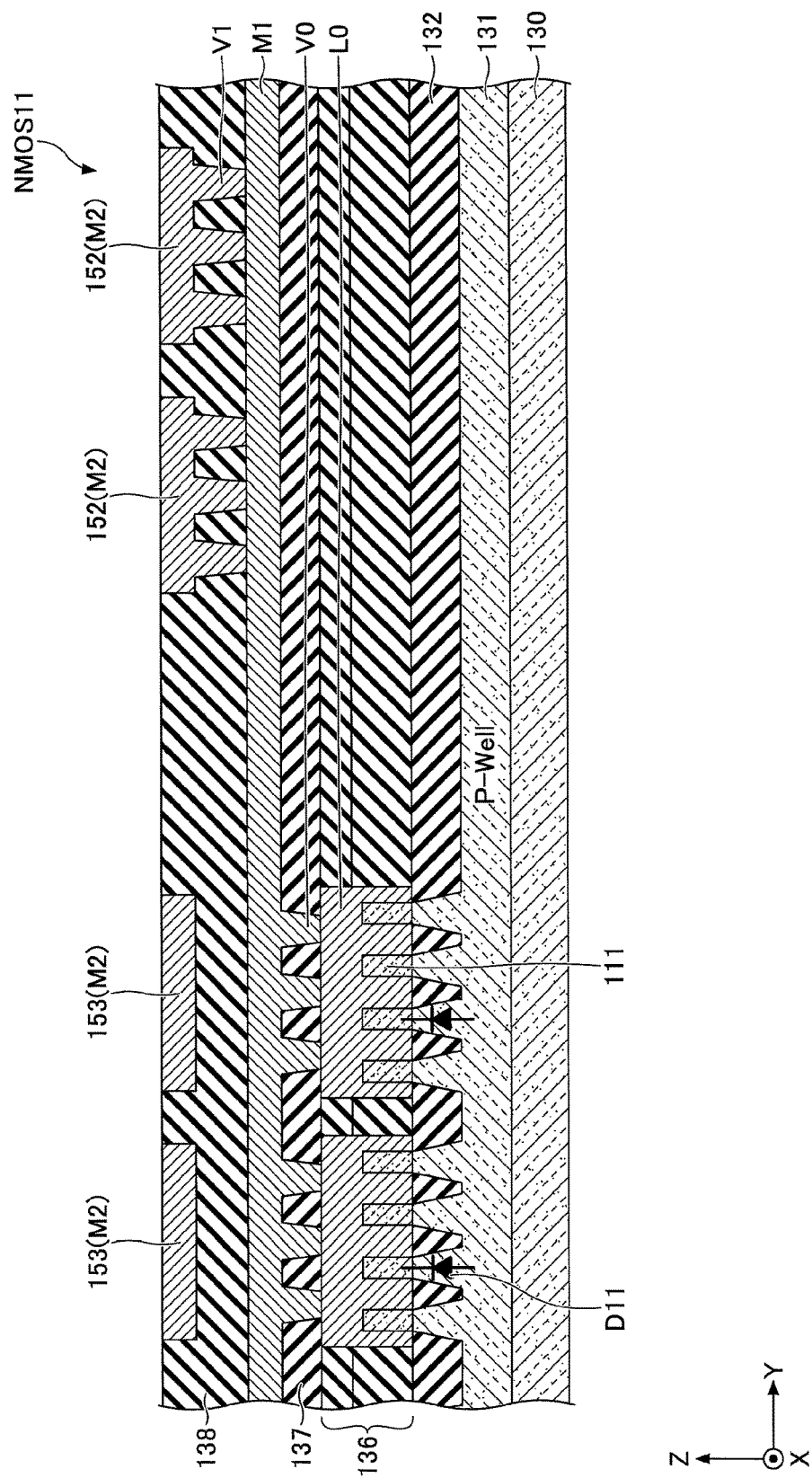
FIG. 11 is a cross sectional view along a line C-C in FIG. 8.
Figure 12:
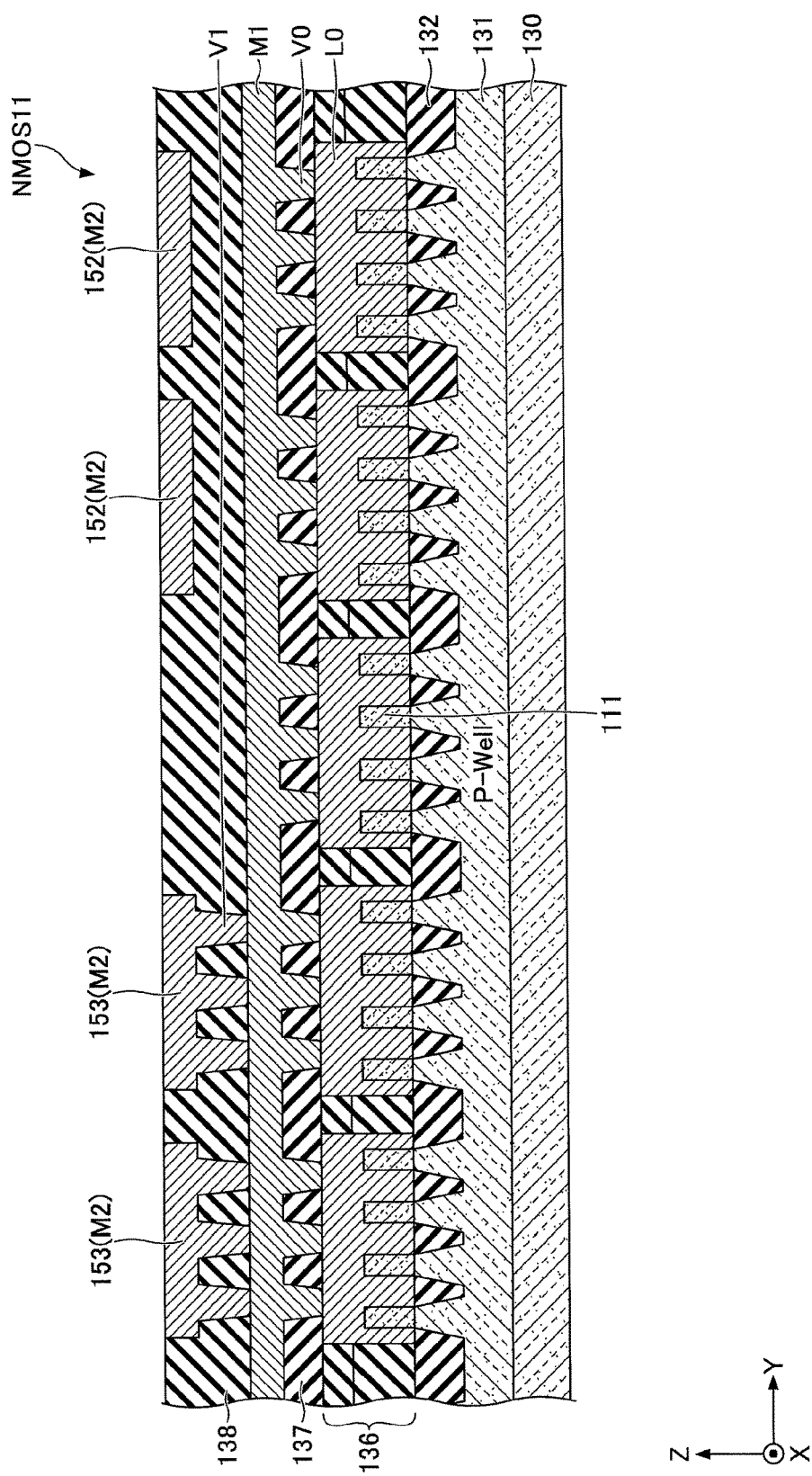
FIG. 12 is a cross sectional view along a line D-D in FIG. 8.

FIG. 8 is a plan view, corresponding to FIG. 3, illustrating the semiconductor device in the first modification of the first embodiment. FIG. 9 is a cross sectional view along a line A-A in FIG. 8. FIG. 10 is a cross sectional view along a line B-B in FIG. 8. FIG. 11 is a cross sectional view along a line C-C in FIG. 8. FIG. 12 is a cross sectional view along a line D-D in FIG. 8.

As illustrated in FIG. 8, the basic arrangement is the same as the arrangement of FIG. 3. However, in the case in which the semiconductor device 1 includes the Fin FETs, unlike the case in which the semiconductor device 1 includes the planar FETs, a plurality of fins extending in the X-direction are arranged along the Y-direction in the NMOSs 11. In addition, the gate electrodes 113, and the local wiring L0 are formed to traverse the plurality of fins in the Y-direction.

In FIG. 8, a dummy gate electrode structure 113D are faulted at terminal ends of the fin. However, the dummy gate electrode structure 113D is not essential, and the dummy gate electrode structure 113D may be omitted.

The guard ring 117 may be formed by fins. In the case in which the semiconductor device 1 includes the planar FETs, one guard ring 117 is, as illustrated in FIG. 2, for example. On the other hand, in the case in which the semiconductor device 1 includes the Fin FETs, a group of isolated fins forms the guard ring 117.

In the example illustrated in FIG. 8, the number of fins of the NMOS 11, and the guard ring 117 is four, however, the number of fins may be one, or two or more but other than four.

Similarly to the case illustrated in FIG. 3, the right part and the left part of the NMOS 11 may have a structure similar to the structure illustrated in FIG. 8.

As illustrated in FIG. 9 and FIG. 10, the fins are formed by patterning the semiconductor substrate, for example. The impurity regions corresponding to the source and the drain of each transistor are formed by ion implantation to the fins. The fins and the wirings of the metal wiring layer M1 are connected through the local wiring L0 and the vias V0 on the local wiring L0. In addition, the local wiring L0 is formed on a part of the gate electrode 113, and the vias V0 and the metal wiring layer M1 are formed on the local wiring L0, although the illustration thereof will be omitted. The vias V0 and the wirings of the metal wiring layer M1 may have the dual damascene structure, for example. In this case, the vias V0 and the wirings of the metal wiring layer M1 may be foamed by a barrier metal layer of tantalum or tantalum nitride, copper, or the like, for example. Further, the local wiring L0 may be formed by a glue layer of titanium nitride, a tungsten layer, or the like, for example.

As illustrated in FIG. 11 and FIG. 12, from the metal wiring layer M1 up to the metal wiring layer M2, the basic cross sectional structures are the same as the cross sectional structures of FIG. 6 and FIG. 7. However, unlike the case in which the semiconductor device 1 includes the planer FETs, the parts forming the source and the drain of the transistor have a fin shape projecting from the substrate 130.

Accordingly, even in the case in which the semiconductor device 1 includes the Fin FETs, the distance W1 and the distance W2 or W3 may be made different in a manner similar to the first embodiment, so that it is possible to cause the ESD current to more easily flow through the part, which is separated with the distance W2 or W3 from the guard ring 117 and has the lower resistance, than through the part, which is separated with the distance W1 form the guard ring 117 and has the higher resistance. As a result, it is possible to reduce the ESD current flowing through the wiring 154 on the guard ring 117, to thereby reduce the EM from being generated in the wiring 154 due to the ESD current.

Similarly as in the case of the first embodiment, the density with which the vias V0 are arranged in the direction in which the guard ring 117 extends, may be high at the parts under the VSS wirings 153 and low at the parts other than under the VSS wirings 153. In addition, the distance between the guard ring 117 and the NMOS 11 may be increased in steps as the distance from the VSS wiring 153 increases. In these cases, it is also possible to obtain effects similar to the effects obtainable by the first embodiment.

[Second Modification of First Embodiment]

A second modification of the first embodiment illustrates an example in which the semiconductor device 1 includes nanowire FETs. In the second modification of the first embodiment, a description of the same constituent elements that have been described above may be omitted.

Figure 13:
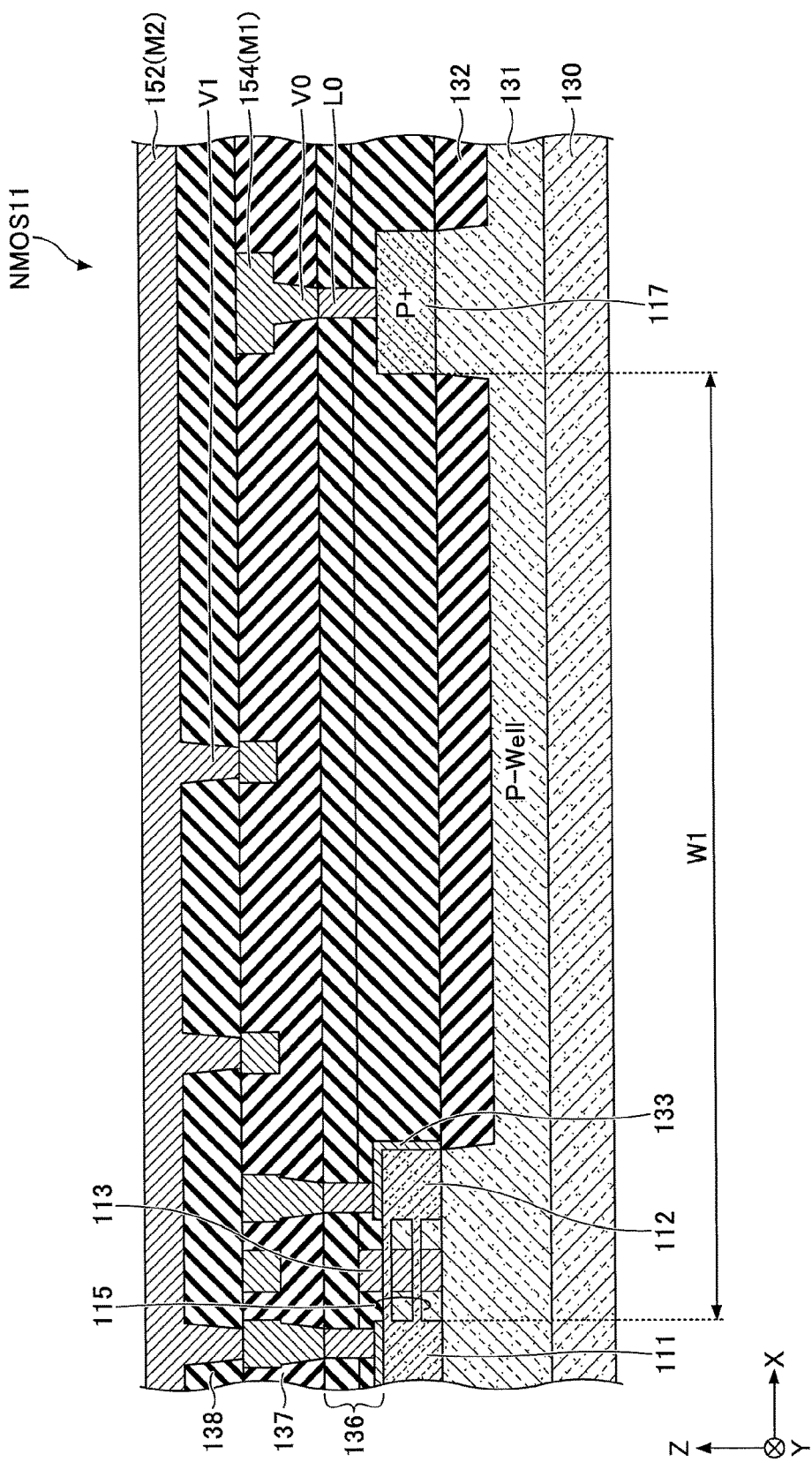
FIG. 13 is a cross sectional view along the line A-A in FIG. 8 in a case in which a semiconductor device 1 includes nanowire FETs.
Figure 14:
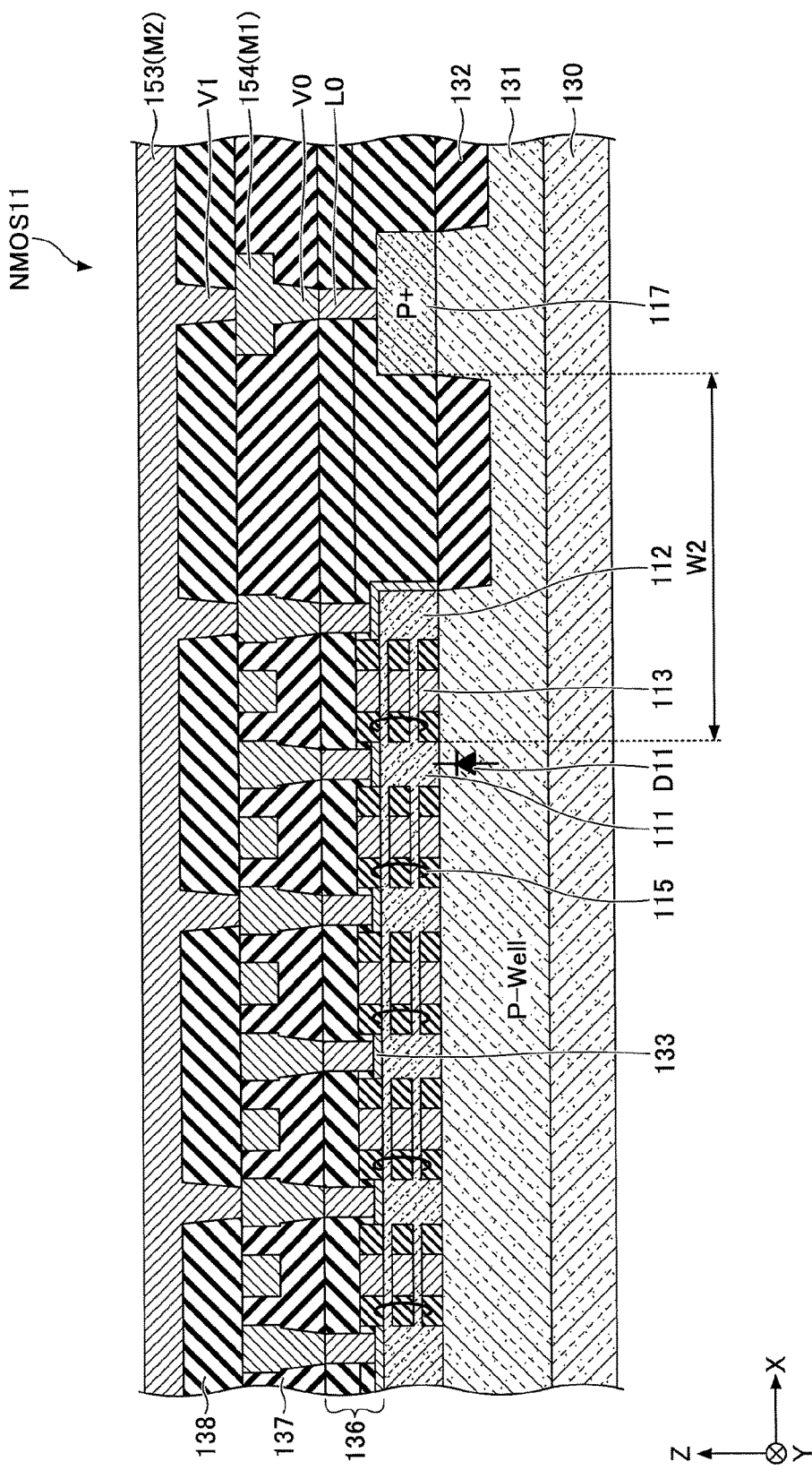
FIG. 14 is a cross sectional view along the line B-B in FIG. 8 in a case in which the semiconductor device 1 includes the nanowire FETs.

A plan view of the semiconductor device 1 in the second modification of the first embodiment is the same as a plan view of FIG. 8, and the illustration thereof will be omitted. FIG. 13 is a cross sectional view along the line A-A in FIG. 8 in a case in which the semiconductor device 1 includes the nanowire FETs. FIG. 14 is a cross sectional view along the line B-B in FIG. 8 in a case in which the semiconductor device 1 includes the nanowire FETs.

As illustrated in FIG. 13 and FIG. 14, the basic cross sectional structures are the same as the cross sectional structures illustrated in FIG. 9 and FIG. 10.

However, in the case in which the semiconductor device 1 includes the nanowire FETs, the channel part of the Fin FET has a wire shape, and the gate insulator layer and the gate electrode are formed to surround the wire-shaped channel part.

The relationship of the distances W1 and W2, the number of vias on the guard ring, the structure in which the distance between the guard ring and the transistor is increased in steps, and the arrangement of the wiring layers may basically be the same as those of the first embodiment and/or the first modification of the first embodiment.

A nanowire 115 schematically illustrated in FIG. 13 and FIG. 14 is a thin wire through which the current flows. Both ends of the nanowire 115 are connected to a plate-shaped structure including parts that faun the source region and the drain region of the nanowire FET. The nanowire 115 is formed by a semiconductor material, such as silicon, germanium, a mixture thereof, or the like, for example, and forms the channel of the transistor. The number of nanowires 115 may be determined arbitrarily. A part of the nanowire 115 overlapping at least the gate electrode 113 is of a conductivity type different from the conductivity type of the source and the drain, or is not implanted with impurities.

In this example, the number of nanowires 115 in the Z-direction is two. However, the number of nanowires 115 in the Z-direction may be one, or three or more. In addition, at the NMOS 11, the number of nanowires 115 in the Y-direction is four. However, the number of nanowires 115 in the Y-direction may be one, or two or more but other than four.

In the example illustrated in FIG. 13 and FIG. 14, the part of the guard ring 117 has a structure having no nanowires, that is, a plate-shaped structure similar to that of the Fin FET. However, the part of the guard ring 117 may have the nanowire structure, if required. Parts that are used as transistors, not limited to the NMOS 11 and the guard ring 117, may be formed as nanowire FETs, and regions other than these parts may be formed to have the plate-shaped structure similar to that of the Fin FETs. More particularly, in the semiconductor device including the nanowire FETs, a well tap region for supplying a potential to the substrate or the well, for example, may have the plate-shaped structure. Compared to the nanowire structure of the nanowire FET, the plate-shaped structure provides a larger area for connecting to the substrate. For this reason, compared to the case in which the structure similar to the nanowire FET is used, the plate-shaped structure can reduce the electrical resistance at the region connecting to the substrate.

Accordingly, even in the case in which the semiconductor device 1 includes the nanowire FETs, the distances W1 and W2 or W3 may be made different in a manner similar to the first embodiment, so that it is possible to cause the ESD current to more easily flow through the part having the distance W2 or W3 and the low resistance, compared to the part having the distance W1 and the high resistance. As a result, it is possible to reduce the ESD current flowing through the wiring on the guard ring 117, to thereby reduce the EM from being generated in the wiring 154 due to the ESD current.

Similarly as in the case of the first embodiment, the density with which the vias V0 are arranged in the direction in which the guard ring 117 extends, may be high at the parts under the VSS wirings 153 and low at the parts other than under the VSS wirings 153. In addition, the distance between the guard ring 117 and the NMOS 11 may be increased in steps as the distance from the VSS wiring 153 increases. In these cases, it is also possible to obtain effects similar to the effects obtainable by the first embodiment.

[Third Modification of First Embodiment]

A third modification of the first embodiment illustrates an example in which an arrangement of the circuit surrounded by the guard ring is different. In the third modification of the first embodiment, a description of the same constituent elements that have been described above may be omitted.

Figure 15:
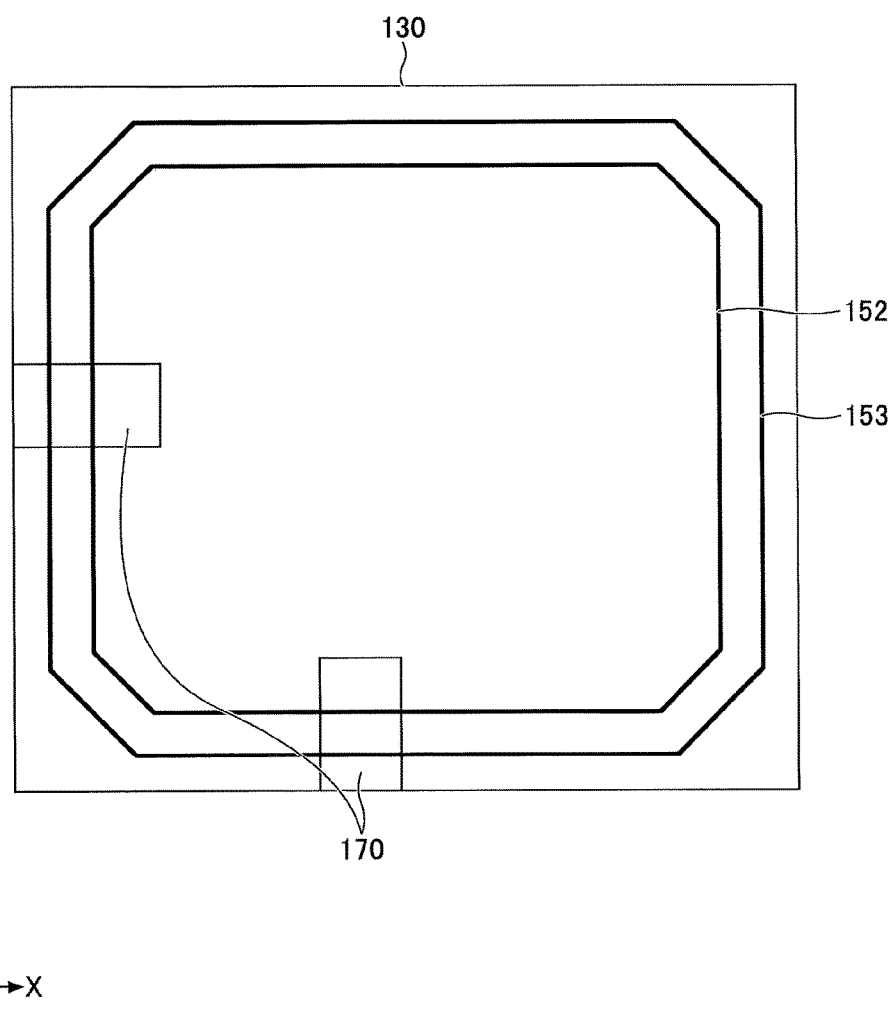

In each of the first embodiments and the first and second modifications thereof described above, the VDD wiring 152 and the VSS wiring 153 may be arranged to surround a periphery of the substrate 130, for example, as illustrated in FIG. 15. The VDD wiring 152 and the VSS wiring 153 are arranged on an inner side of a moisture-proof ring (not illustrated) that is provided to prevent moisture or the like from entering inside the semiconductor device. However, it is not essential for the VDD wiring 152 and the VSS wiring 153 to have a ring shape, and the VDD wiring 152 may be arranged on an outer side of the VSS wiring 153. In addition, a plurality of VDD wirings 152 may be provided, and a plurality of VSS wirings 153 may be provided. Further, the plurality of VSS wirings 153 may be arranged between the plurality of VDD wirings 152, and the plurality of VDD wirings 152 and the plurality of VSS wirings 153 may be arranged alternately.

An I/O (Input/Output) cell 170 illustrated in FIG. 15 is a cell in which semiconductor elements for input and/or output are provided. The I/O cell 170 is arranged in a periphery of the substrate 130, at an upper or lower side (side extending in the X-direction) of the substrate 130, or at a right or left side (a side extending in the Y-direction) of the substrate 130. A circuit in one embodiment of the present invention, corresponding to the parts surrounded by the guard ring 117, is arranged within the I/O cell 170. However, a part or all of the I/O cell 170 may be positioned below a power supply pad, a signal input/output pad, or a dummy pad.

In a case in which the I/O cell 170 is arranged at the upper or lower side (side extending in the X-direction) of the substrate 130, the NMOSs 11 may be arranged to align in the Y-direction, as described above in conjunction with the first embodiment and the first and second modifications thereof. On the other hand, in a case in which the I/O cell 170 is arranged at the right or left side (side extending in the Y-direction) of the substrate 130, the NMOSs 11 may be arranged to align in the X-direction, as illustrated in FIG. 16.

More particularly, in the case in which the I/O cell 170 is arranged at the right or left side (side extending in the Y-direction) of the substrate 130, the VDD wirings 152 and the VSS wirings 153 extend in the Y-direction and are arranged side by side in the X-direction. For this reason, the positions of the parts having the different distances between the NMOS 11 and the guard ring 117, namely, the distance W1 and the distance W2 or W3, become different from the positions of the corresponding parts having the different distances between the NMOS 11 and the guard ring 117 in the case in which the I/O cell 170 is arranged at the upper or lower side (side extending in the X-direction) of the substrate 130. In other words, the parts having the different distances W1 and W2 are arranged to align in the Y-direction in the first embodiment and the first and second modifications thereof, but the parts having the different distances W1 and W2 are arranged to align in the X-direction in the third modification of the first embodiment, as illustrated in FIG. 16.

When aligning the NMOSs 11 within a chip, particularly in the case where the Fin FETs or the nanowire FETs are used, the arrangement within the circuit may be modified depending on the position within the chip. However, the circuit of the modified arrangement is equivalent to the circuit of the first embodiment and the first and second modifications thereof.

Figure 16:
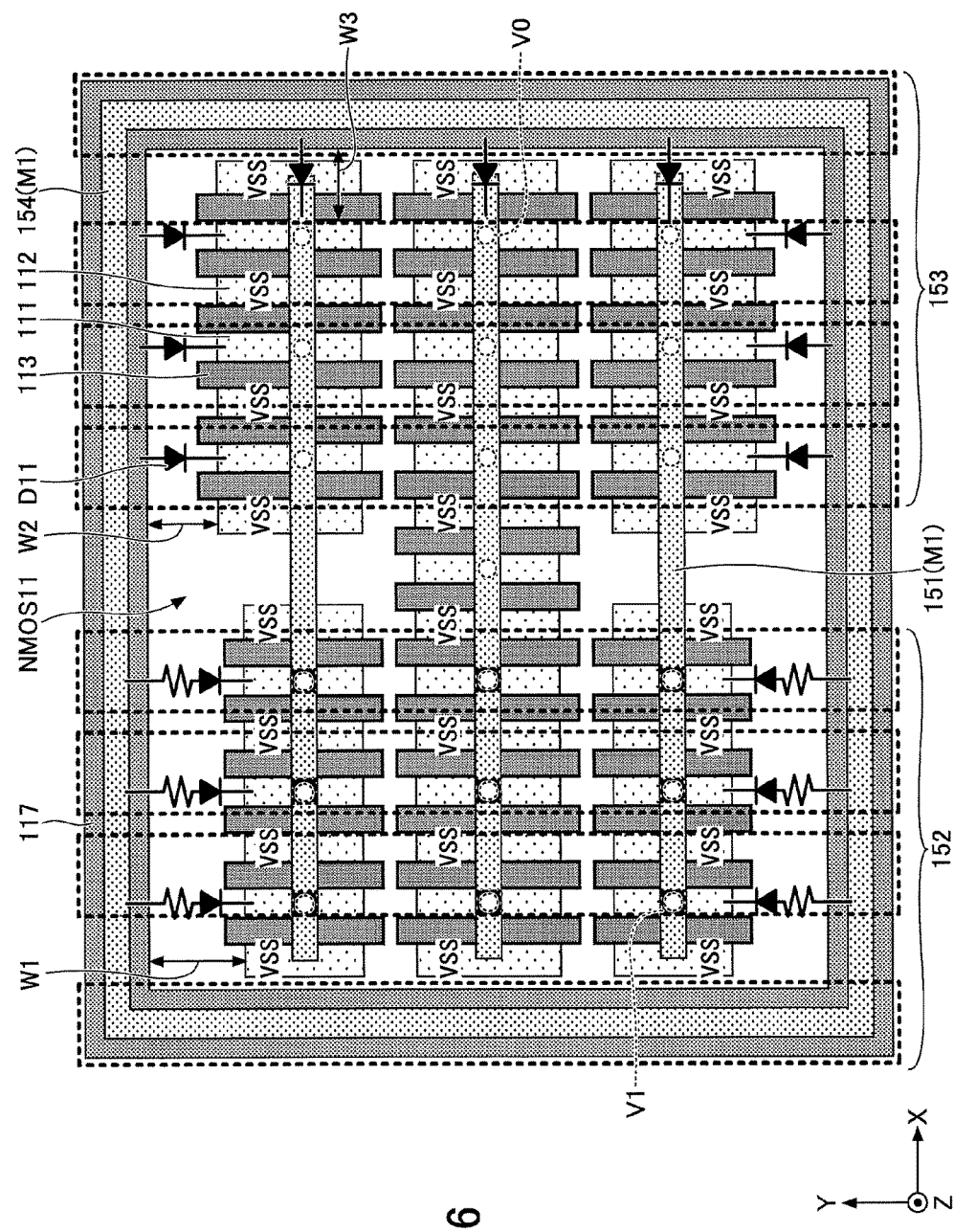
FIG. 16 is a plan view illustrating an example of the structure of the semiconductor device in a third modification of the first embodiment.

In FIG. 16, the illustration of the vias V0 arranged on the guard ring 117, the wiring of the metal wiring layer M1 mutually electrically connecting the plurality of impurity regions 112, and the wiring of the metal wiring layer M1 mutually electrically connecting the plurality of gate electrodes 113 is omitted.

[Second Embodiment]

A second embodiment illustrates an example in which the change in the distance between the NMOS and the guard ring is different from that of the first embodiment. In the second embodiment, a description of the same constituent elements that have been described above may be omitted.

Figure 17:
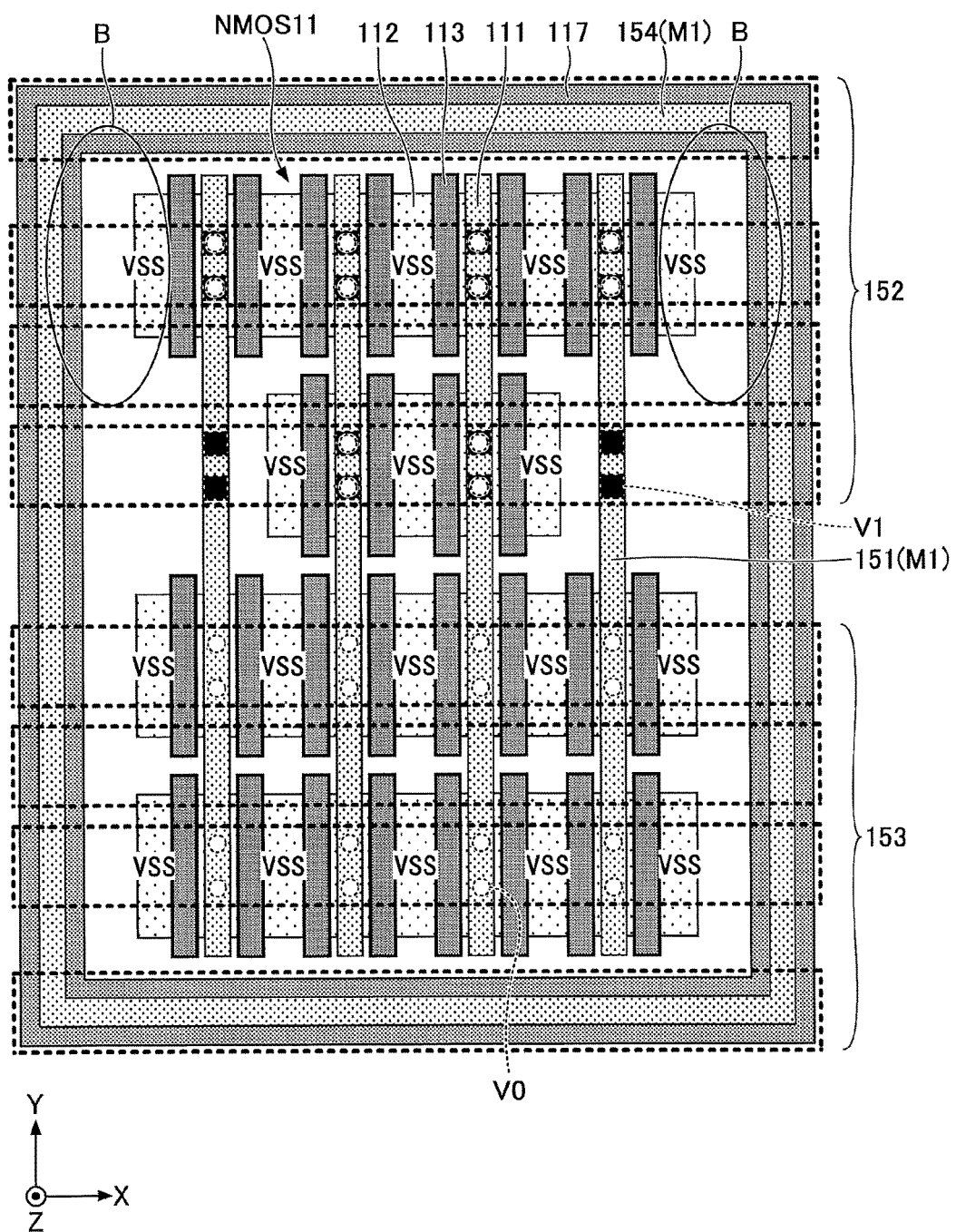
FIG. 17 is a plan view illustrating an example of the structure of the semiconductor device in a second embodiment.

FIG. 17 is a plan view illustrating an example of the structure of the semiconductor device in the second embodiment. In FIG. 17, an upper part has a hammer type structure, and differs from the structure illustrated in FIG. 2 in that the distance between the NMOS 11 and the guard ring 117 is shorter at parts B that are located at positions separated from the VSS wiring 153. In other words, in a plan view illustrated in FIG. 17, the part B where the NMOS 11 is separated with shorter distance from the guard ring 117, is located on both sides along the Y-direction of the part where the NMOS 11 is separated with longer distance from the guard ring 117.

In addition, in FIG. 17, the illustration of the vias V0 arranged on the guard ring 117, the wiring of the metal wiring layer M1 mutually electrically connecting the plurality of impurity regions 112, and the wiring of the metal wiring layer M1 mutually electrically connecting the plurality of gate electrodes 113 is omitted.

In FIG. 17, the part B is located at the position separated from the VSS wiring 153, and the ESD current uneasily flows to the part B where the distance between the NMOS 11 and the guard ring 117 is shorter, because the resistance from the VSS wiring 153 to the part B is high. For this reason, it is possible to increase the number of NMOSs 11 inside the guard ring 117 while obtaining the effect of reducing the EM. As a result, it is possible to improve the performance of the semiconductor device 1, such as the driving capability of the semiconductor device 1, the protection capability against the ESD surge with respect to the protected circuit, or the like, for example.

As illustrated in FIG. 17, the part B may be located at the position overlapping the VDD wirings 152 in a plan view. In addition, as illustrated in FIG. 17, the wiring 151 including a part extending in the Y-direction at a position (on the STI 132 between the guard ring 117 and the impurity region 112) not overlapping the impurity region 111 in a plan view, may connect to the impurity region 111 of the NMOS 11 at the part B and to the impurity region 111 at the position overlapping the VSS wiring 153. Further, the distance between the guard ring 117 and the impurity region 111 in the part B may be the same as the distance between the guard ring 117 and the impurity region 111 at the position overlapping the VSS wiring 153.

The structure of the semiconductor device in the second embodiment is otherwise the same as the structure of the semiconductor device in the first embodiment. The second embodiment may use the various types of FETs described in conjunction with the first and second modifications of the first embodiment. The second embodiment may modify the arrangement of the circuit, or modify the alignment of the FETs, similarly as in the case of the third modification of the first embodiment. In addition to providing the NMOSs 11 between the ground terminal VSS and the power supply terminal VDD, the NMOSs 11 may be provided between the ground terminal VSS and the input and output terminal (or pad), in place of the power supply terminal VDD.

[Third Embodiment]

A third embodiment illustrates an example in which PMOSs are used in place of the NMOSs. In the third embodiment, a description of the same constituent elements that have been described above may be omitted.

Figure 18:
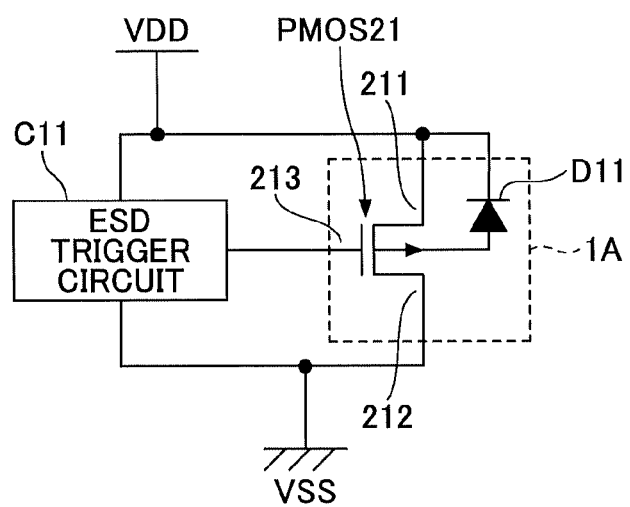
FIG. 18 is a circuit diagram of the semiconductor device in a third embodiment.

FIG. 18 is a circuit diagram of the semiconductor device in the third embodiment. As illustrated in FIG. 18, a semiconductor device 1A includes a PMOS 21 which is a P-channel MOSFET. The PMOS 21 is an example of a second transistor. The PMOS 21 is connected between the power supply terminal VDD and the ground terminal VSS. The ESD trigger circuit C11 is connected to a gate electrode 213 of the PMOS 21. The reference numeral D11 denotes the parasitic diode.

Figure 19:
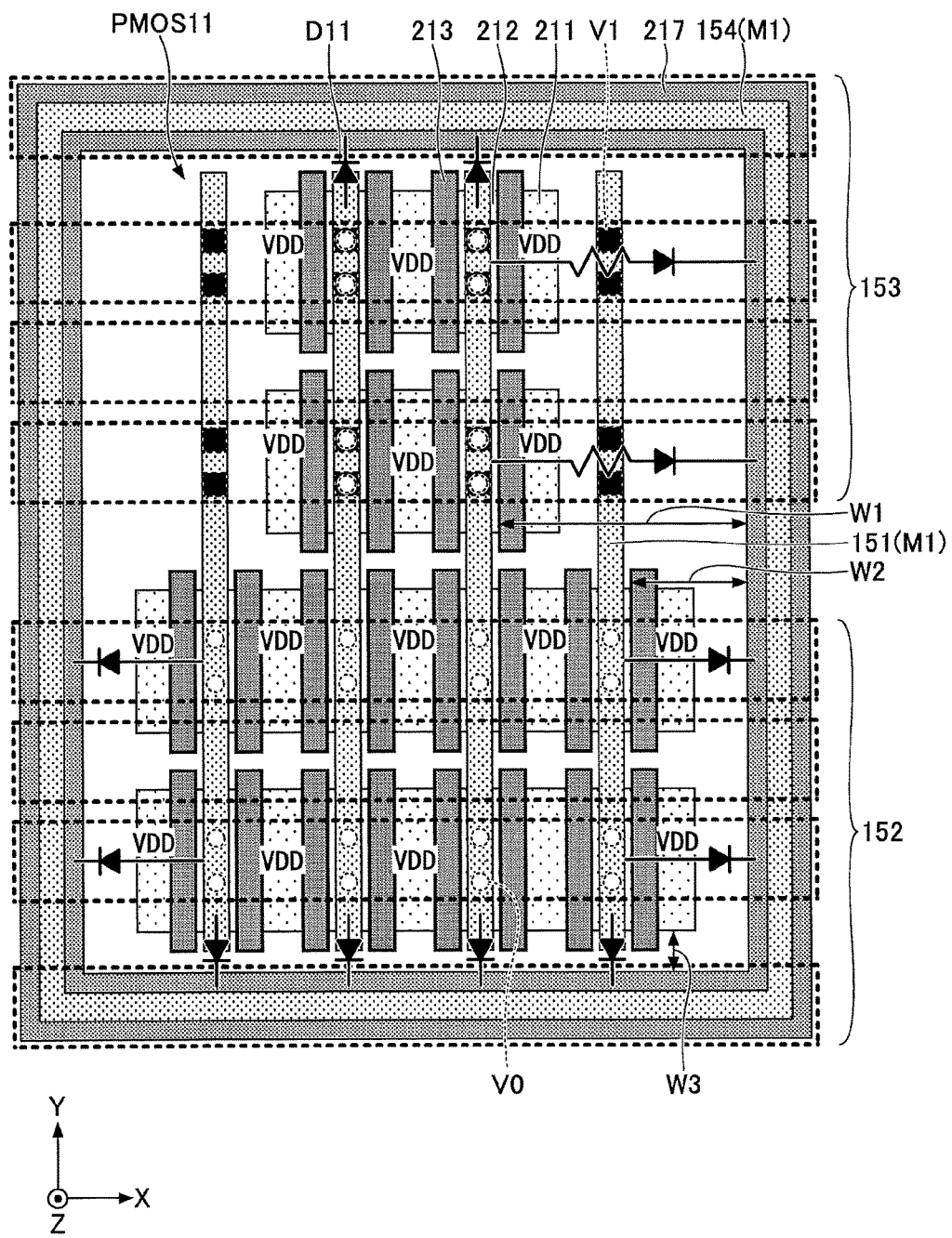
FIG. 19 is a plan view illustrating an example of the structure of the semiconductor device in the third embodiment.

FIG. 19 is a plan view illustrating an example of the structure of the semiconductor device in the third embodiment. As illustrated in FIG. 18 and FIG. 19, in the semiconductor device 1A, a third impurity region 211 of the P-type, in the PMOS 21, is electrically connected to the power supply terminal VDD via the VDD wiring 152. In addition, a fourth impurity region 212 of the P-type, in the PMOS 21, is electrically connected to the ground terminal VSS via the VSS wiring 153. Further, the impurity regions 212 of the PMOSs 21 that are arranged in the Y-direction are electrically connected to the wirings 151. The wirings 151 is illustrated in a simplified manner.

In FIG. 19, the illustration of the vias V0 arranged on a guard ring 217, a wiring of the wiring layer M1 electrically connecting a plurality of impurity regions 211, and a wiring of the wiring layer M1 electrically connecting a plurality of gate electrodes 213 is omitted.

The impurity regions 211 and 212 and the gate electrode 213 of a plurality of PMOSs 11 are surrounded by a guard ring 117 in a plan view. The guard ring 217 is an example of a second guard ring, and is formed by an N-type impurity region. The guard ring 217 is connected to the VDD wirings 152 through the wiring 154 of the metal wiring layer M1 that is arranged on the guard ring 217.

When it is assumed that the ESD current flows from the ground terminal VSS to the power supply terminal VDD in a structure in which no difference is provided between the distance W1 and the distance W2 or W3, the ESD current, after flowing through the part under the VSS wiring 153, reaches the power supply terminal VDD through the wiring 154 of the metal wiring layer M1. For this reason, EM may be generated in the wiring 154.

On the other hand, in the semiconductor device 1A, the distance W2 or W3 between the guard ring 217 and the impurity region 212 of the PMOS 21 at the part under the VDD wiring 152 through which the ESD current is to flow, is shorter than the distance W1 between the guard ring 217 and the impurity region 212 of the PMOS 21 at other parts, as illustrated in FIG. 19.

In other words, the part having the long distance (part having the distance W1) from the guard ring 217 in a plan view is located at the position separated from (non-overlapping) the VDD wiring 152 in a plan view, and the part having the short distance (part having the distance W2 or W3) from the guard ring 217 in a plan view is located at the position overlapping the VDD wiring 152 in a plan view.

Hence, the ESD current more easily flows through the part having the distance W2 or W3 and the low resistance, than the part having the distance W1 and the high resistance. As a result, it is possible to reduce the ESD current flowing through the wiring 154 on the guard ring 217, to thereby reduce the EM from being generated in the wiring 154 due to the ESD current.

The ESD current flows from the VSS wiring 153 to the PMOS 21 under the VDD wiring 152, through the wiring 151. However, because more wirings 151 are arranged compared to the wiring 154 on the guard ring 217, the ESD current is distributed, and the EM is uneasily generated.

The third embodiment may use, for the PMOSs 21, the various types of FETs described in conjunction with the first and second modifications of the first embodiment. The third embodiment may modify the arrangement of the circuit, or modify the alignment of the FETs, similarly as in the case of the third modification of the first embodiment. In addition to providing the PMOSs 21 between the ground terminal VSS and the power supply terminal VDD, the PMOSs 21 may be provided between the ground terminal VSS and the input and output terminal (or pad), in place of the power supply terminal VDD. Further, the third embodiment may have the hammer type structure in which the PMOS located at the position separated from the VDD wiring 152 is arranged close to the guard ring 217, similarly as in the case of the second embodiment.

[Protected Circuit]

Each of the embodiments and each of the modifications described above may be applied to circuits other than the circuits illustrated in FIG. 1 and FIG. 18. A description will be given of the protected circuit to which each of the embodiments and each of the modifications described above may be applied. In the following, a description of the same constituent elements that have been described above may be omitted.

Figure 20:
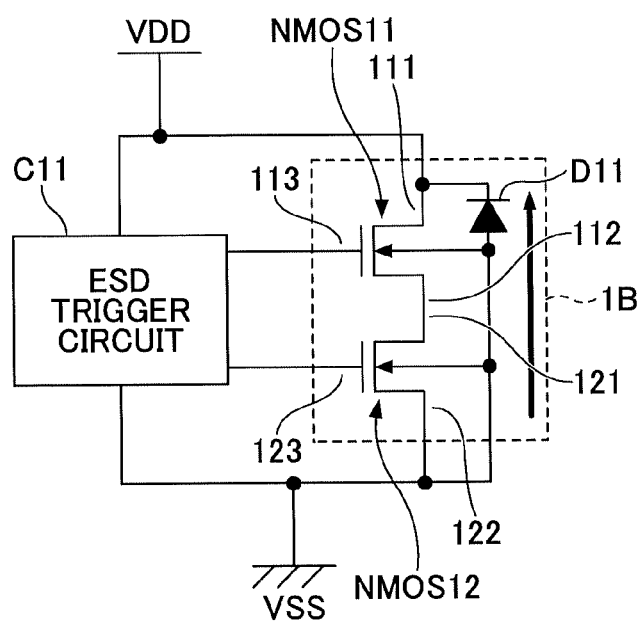
FIG. 20 is a circuit diagram of another target circuit.

FIG. 20 is a circuit diagram of another target circuit (part 1). As illustrated in FIG. 20, a semiconductor device 1B includes an NMOS 11 which is an N-channel MOSFET, and an NMOS 12 which is an N-channel MOSFET. The NMOS 11 and the NMOS 12 are connected in series between the power supply terminal VDD and the ground terminal VSS.

More particularly, in the semiconductor device 1B, the impurity region 111 of the N-type, in the NMOS 11, is connected to the power supply terminal VDD through the VDD wiring. In addition, the impurity region 122 of the N-type, in the NMOS 12, is connected to the ground terminal VSS through the VSS wiring. Further, the impurity region 112 of the N-type, in the NMOS 11, and the impurity region 121 of the N-type, in the NMOS 12, are connected.

The ESD trigger circuit C11 is connected to the gate electrode 113 of the NMOS 11 and to the gate electrode 123 of the NMOS 12. The reference numeral D11 denotes the parasitic diode.

Figure 21A:
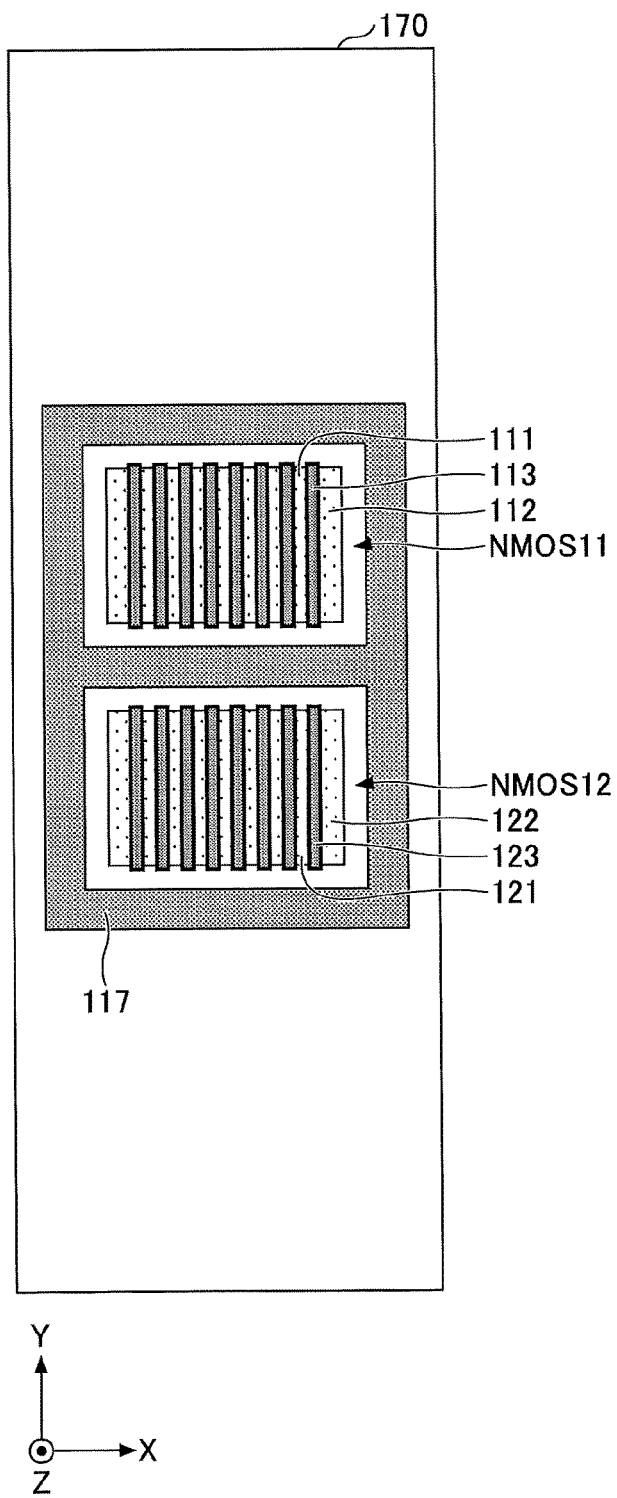
FIG. 21A and FIG. 21B are plan views illustrating the structures of the semiconductor device illustrated in FIG. 20.
Figure 21B:
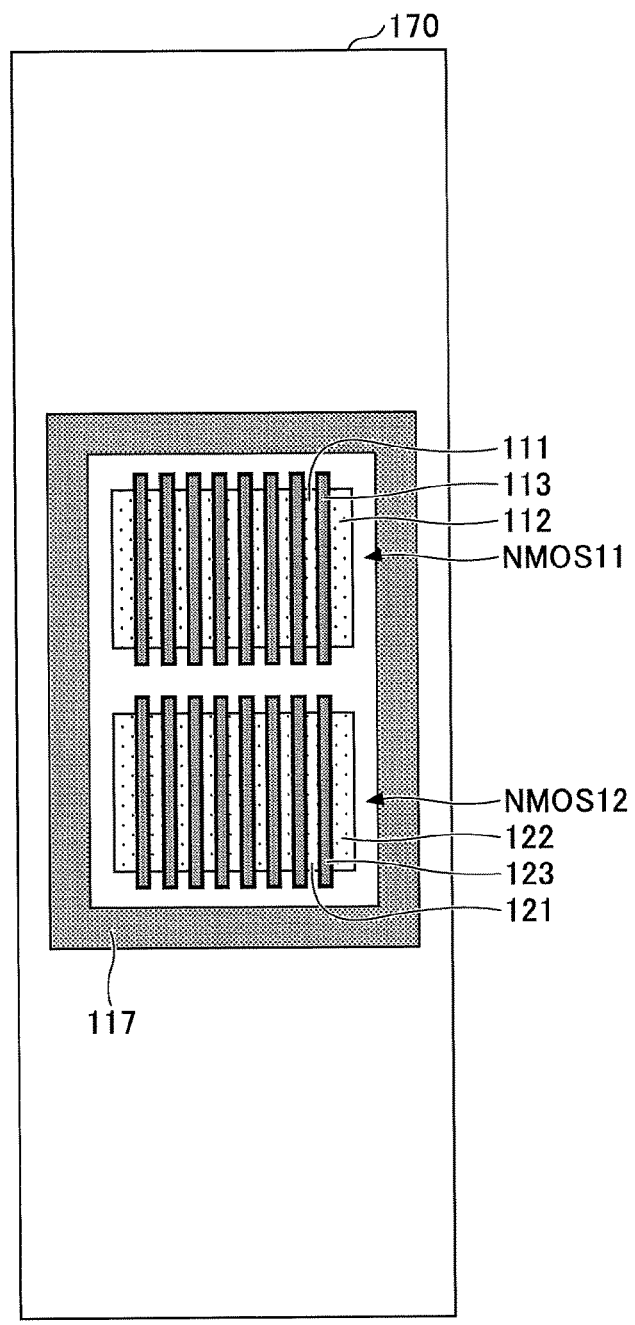

FIG. 21A and FIG. 21B are plan views illustrating the structures of the semiconductor device illustrated in FIG. 20. FIG. 21A illustrates an example in which the NMOSs 11 and 12 are surrounded by the guard ring 117 within the I/O cell 170.

The VDD wiring 152 (not illustrated) connects to the impurity region 111 of the NMOSs 11. Hence, the distances W1 and W2 or W3 for the NMOSs 11 are made different in a manner similar to the first and second embodiments and the modifications described above.

Hence, the ESD current easily flows through the part having the distance W2 or W3 and the low resistance than through the part having the distance W1 and the high resistance. As a result, it is possible to reduce the ESD current flowing through the wiring on the guard ring 117, and reduce the EM from being generated in the wiring due to the ESD current.

FIG. 21B illustrates an example in which the part of the guard ring 117 extending in the X-direction between the NMOSs 11 and the NMOSs 12 is omitted.

In the examples illustrated in FIG. 21A and FIG. 21B, the NMOS 11 and the NMOS 12 are arranged side by side in the Y-direction. However, the NMOS 11 and the NMOS 12 may be alternately arranged in the X-direction, for example.

Figure 22:
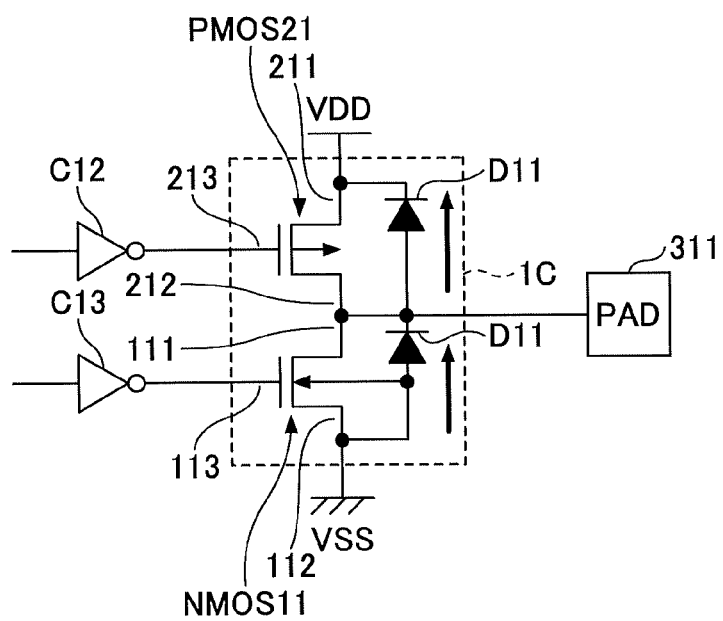
FIG. 22 is a circuit diagram of another target circuit.

FIG. 22 is a circuit diagram of another target circuit (part 2). As illustrated in FIG. 22, a semiconductor device 1C includes a PMOS 21 which is a P-channel MOSFET, and an NMOS 11 which is an N-channel MOSFET. The PMOS 21 and the NMOS 11 are connected in series between the power supply terminal VDD and the ground terminal VSS.

More particularly, in the semiconductor device 1C, the impurity region 211 of the P-type, in the PMOS 21, is connected to the power supply terminal VDD through the VDD wiring. In addition, the impurity region 111 of the N-type, in the NMOS 11, is connected to the ground terminal VSS through the VSS wiring. Further, the impurity region 212 of the P-type, in the PMOS 21, and the impurity region 111 of the N-type, in the NMOS 11, are connected. An input and output terminal (hereinafter also referred to as "input and output pad") 311 is further connected to a connecting part connecting the impurity region 212 and the impurity region 111.

A driving circuit C12 is connected to the gate electrode 213 of the PMOS 21, and a driving circuit C13 is connected to the gate electrode 113 of the NMOS 11. The reference numeral D11 denotes the parasitic diode.

Figure 23:
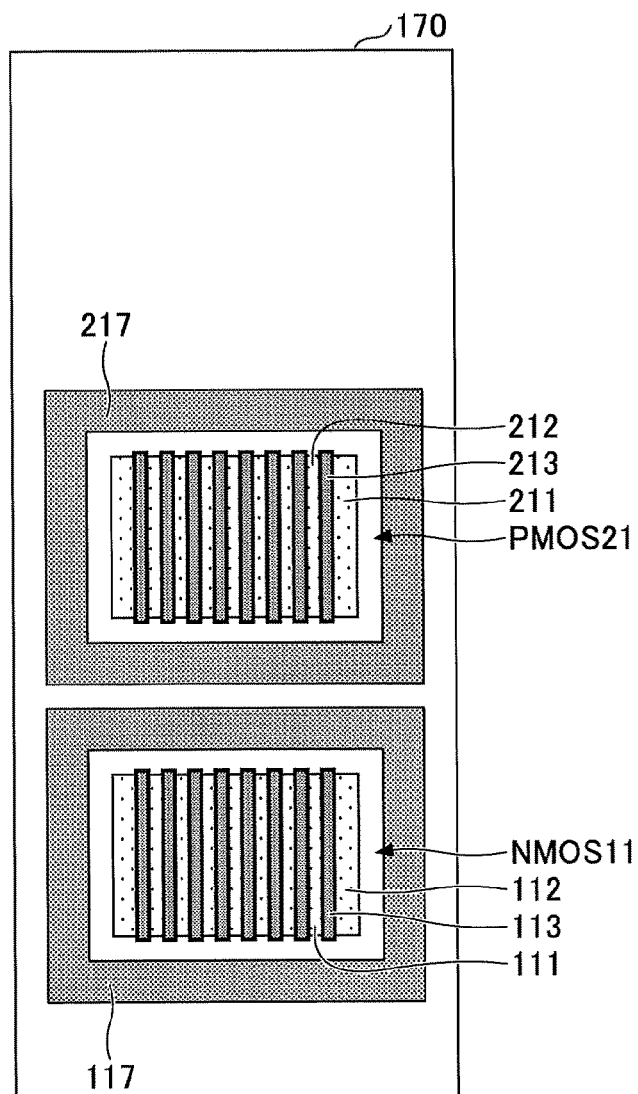
FIG. 23 is a plan view illustrating the structure of the semiconductor device illustrated in FIG. 22.

FIG. 23 is a plan view illustrating the structure of the semiconductor device illustrated in FIG. 22. In FIG. 23, the PMOSs 21 are surrounded by the guard ring 217 of the N-type, and the NMOSs 11 are surrounded by the guard ring 117 of the P-type, within the I/O cell 170.

The distances W1 and W2 or W3 may be made different for the PMOS 21 in a manner similar to the third embodiment described above. The distances W1 and W2 or W3 may be made different for the NMOS 11 in a manner similar to the first and second embodiments and the modifications described above.

Hence, the ESD current easily flows through the part having the distance W2 or W3 and the low resistance than through the part having the distance W1 and the high resistance. As a result, it is possible to reduce the ESD current from being generated in the wiring from the input and output pad 311 to the power supply terminal VDD, and in the wiring from the ground terminal VSS to the input and output pad 311.

Figure 24:
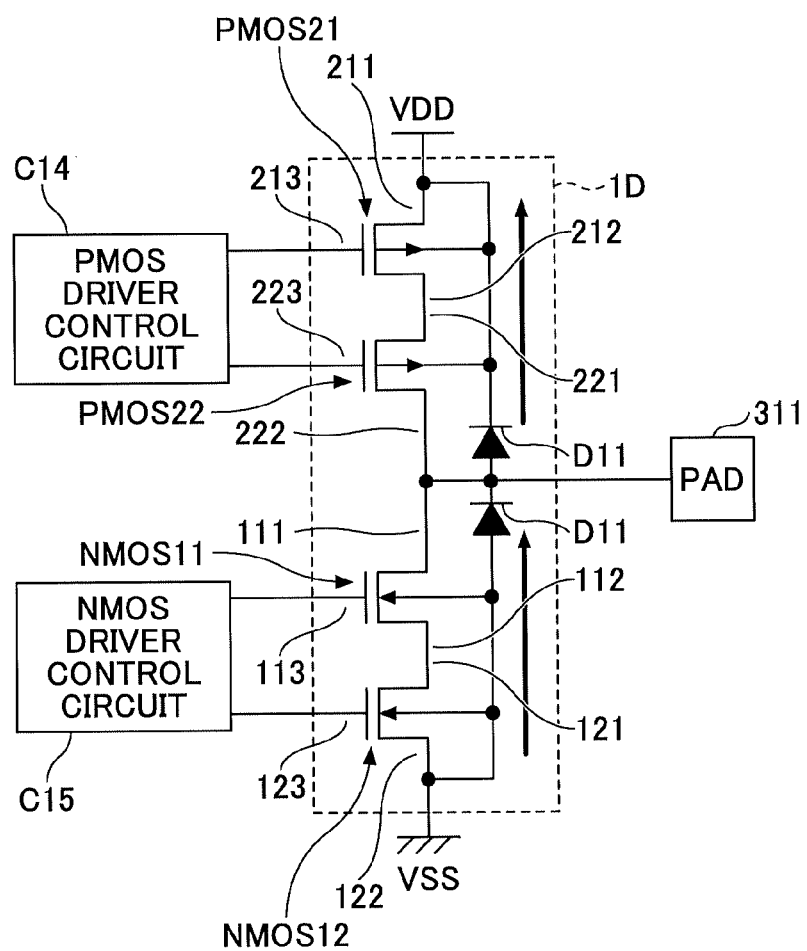
FIG. 24 is a circuit diagram of another target circuit.

FIG. 24 is a circuit diagram of another target circuit (part 3). As illustrated in FIG. 24, a semiconductor device 1D includes PMOSs 21 and 22 which are P-channel MOSFETs, and NMOSs 11 and 12 which are N-channel MOSFETs. The PMOSs 21 and 22, and the NMOSs 11 and 12 are connected in series between the power supply terminal VDD and the ground terminal VSS.

More particularly, in the semiconductor device 1D, the impurity region 211 of the P-type, in the PMOS 21, is connected to the power supply terminal VDD through the VDD wiring. In addition, the impurity region 212 of the P-type, in the PMOS 21, is connected to an impurity region 221 of the P-type, in the PMOS 22.

In addition, in the semiconductor device 1D, the impurity region 122 of the N-type, in the NMOS 12, is connected to the ground terminal VSS through the VSS wiring. In addition, the impurity region 121 of the N-type, in the NMOS 12, is connected to the impurity region 112 of the N-type, in the NMOS 11.

Further, an impurity region 222 of the P-type, in the PMOS 22, and the impurity region 111 of the N-type, in the NMOS 11, are connected. The input and output pad 311 is further connected to a connecting part connecting the impurity region 222 and the impurity region 111.

A PMOS driver control circuit C14 is connected to the gate electrode 213 of the PMOS 21 and to a gate electrode 223 of the PMOS 22. An NMOS driver control circuit C15 is connected to the gate electrode 113 of the NMOS 11 and to the gate electrode 123 of the NMOS 12. The reference numeral D11 denotes the parasitic diode.

Figure 25A:
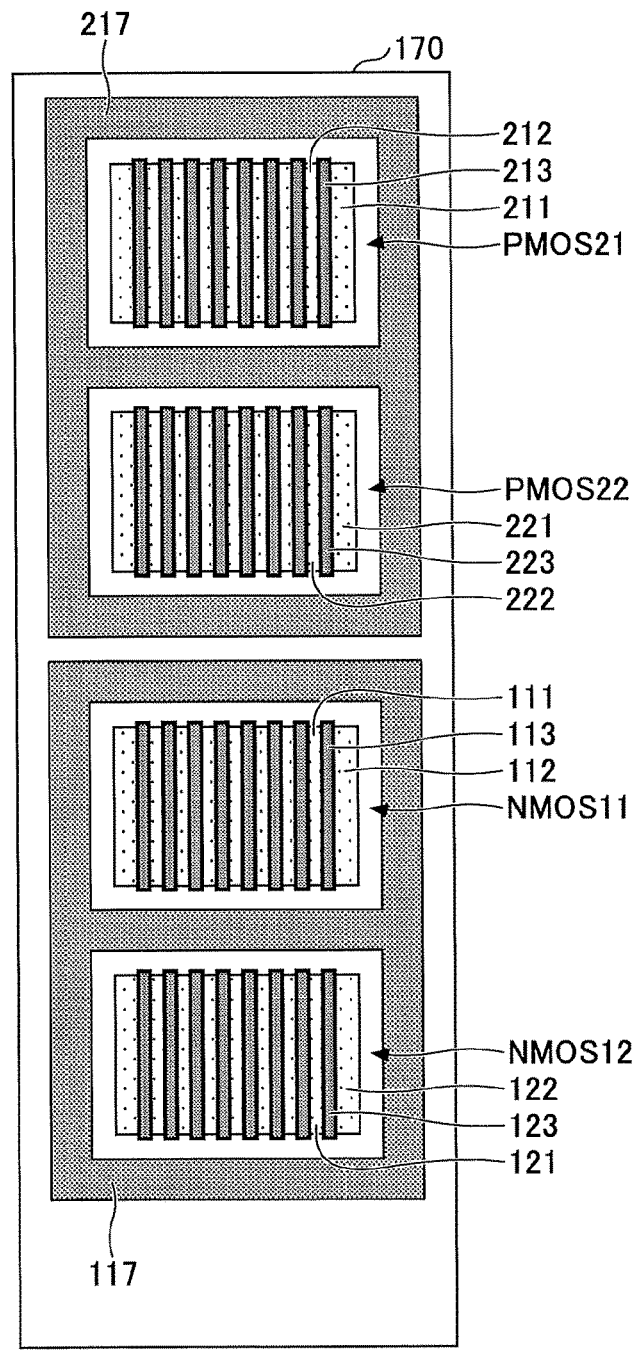
FIG. 25A and FIG. 25B are plan views illustrating the structures of the semiconductor device illustrated in FIG. 24.
Figure 25B:
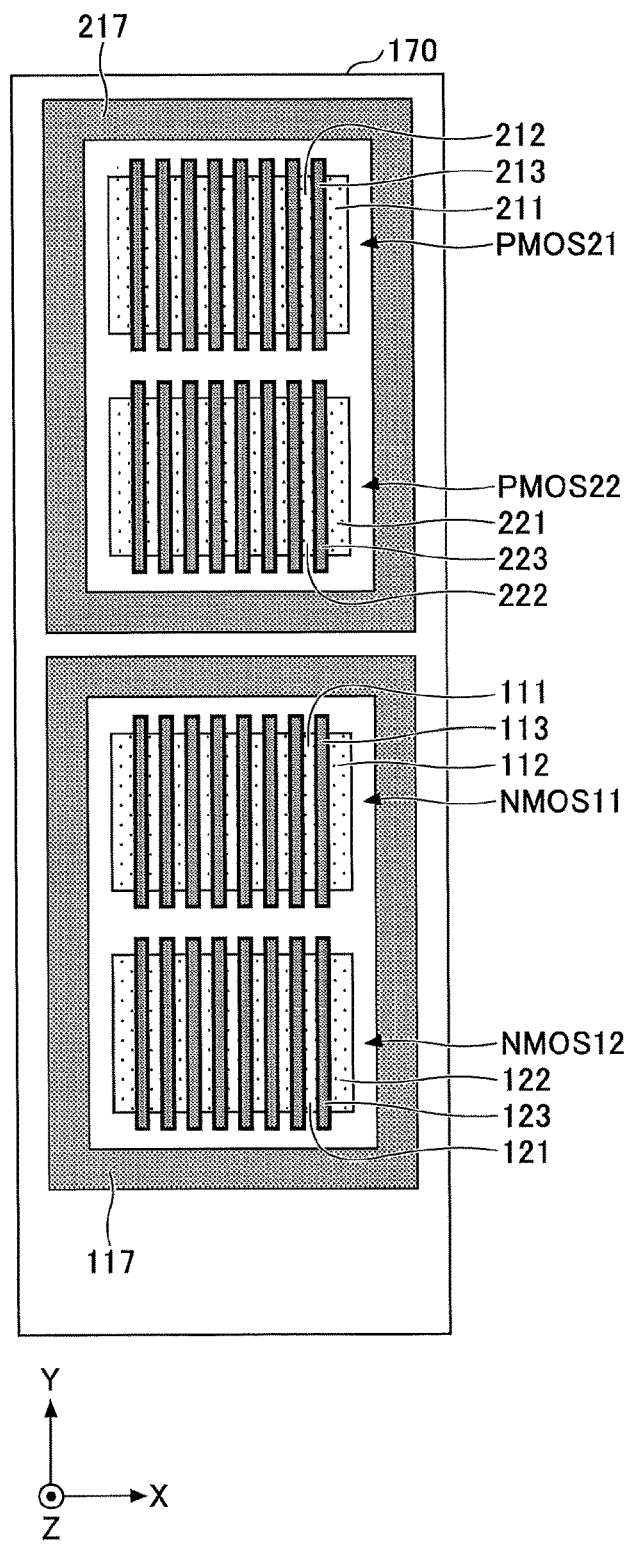

FIG. 25A and FIG. 25B are plan views illustrating the structures of the semiconductor device illustrated in FIG. 24. FIG. 25A illustrates an example in which the PMOSs 21 and 22 are surrounded by the guard ring 217 of the N-type, within the I/O cell 170, and the NMOSs 11 and 12 are surrounded by the guard ring 117 that is formed by the P-type impurity region, within the I/O cell 170.

The VDD wiring 152 (not illustrated) connects to the impurity region 211 of the PMOSs 21. Hence, the distances W1 and W2 or W3 for the PMOSs 21 are made different in a manner similar to the third embodiment described above. In addition, the distances W1 and W2 or W3 for the NMOSs 11 are made different in a manner similar to the first and second embodiments and the modifications described above, that is, similarly as in the case of the circuit illustrated in FIG. 20.

Hence, the ESD current easily flows through the part having the distance W2 or W3 and the low resistance than through the part having the distance W1 and the high resistance. As a result, it is possible to reduce the ESD current flowing through the wiring from the input and output pad 311 to the power supply terminal VDD, and through the wiring from the ground terminal VSS to the input and output pad 311, to reduce the EM from being generated in these wirings due to the ESD current.

FIG. 25B illustrates an example in which the part of the guard ring 117 extending in the X-direction between the NMOSs 11 and the NMOSs 12 is omitted. Similarly, the part of the guard ring 217 extending in the X-direction between the PMOSs 21 and the PMOSs 22 may be omitted.

[Fourth Embodiment]

A fourth embodiment illustrates an example in which the circuit illustrated in FIG. 20 or the like is arranged inside the guard ring. In the fourth embodiment, a description of the same constituent elements that have been described above may be omitted.

Figure 26:
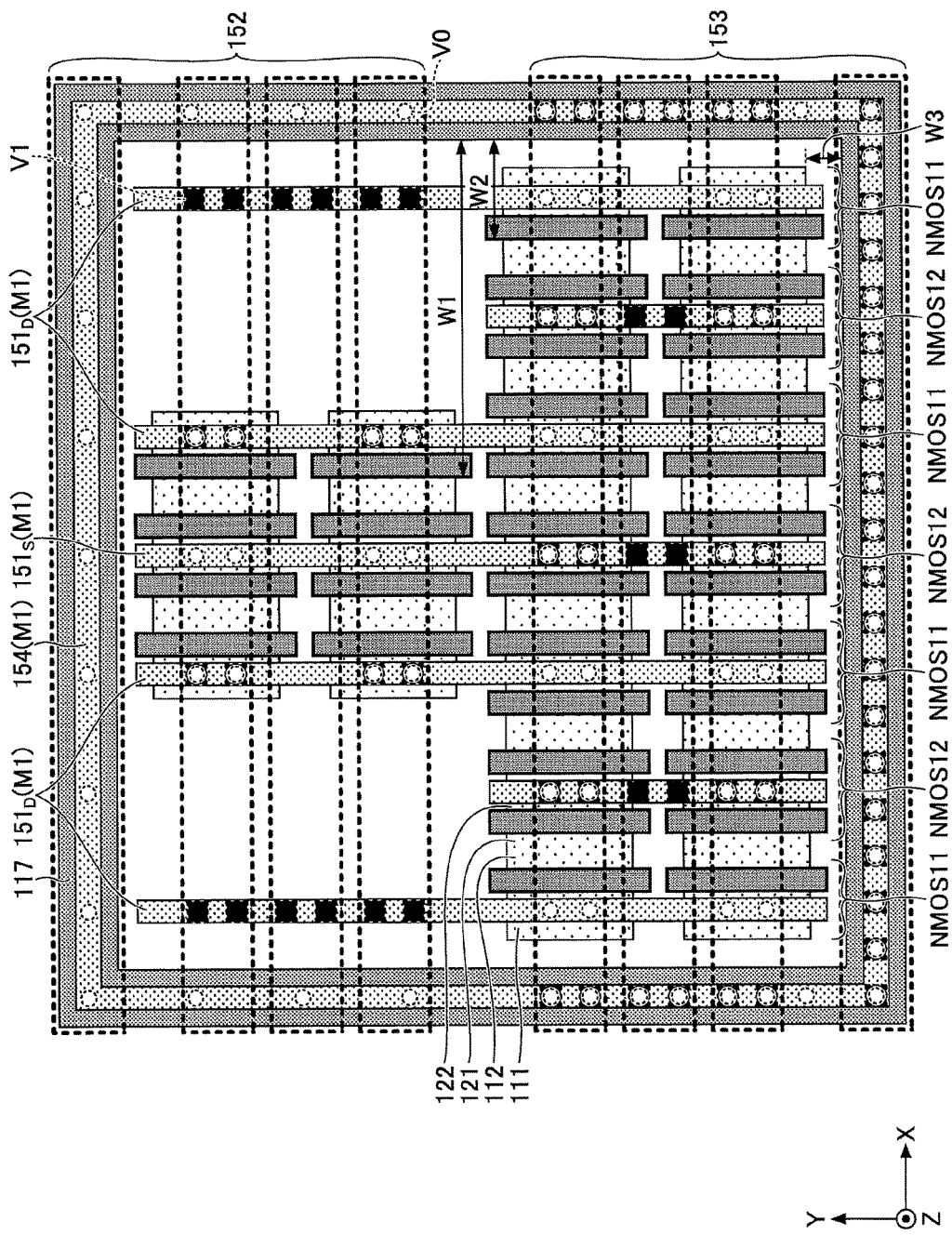
FIG. 26 is a plan view illustrating the structure of the semiconductor device in a fourth embodiment.

FIG. 26 is a plan view illustrating the structure of the semiconductor device in the fourth embodiment. For example, in a circuit illustrated in FIG. 20 in which the NMOSs 11 and 12 are connected between the power supply terminal VDD and the ground terminal VSS in a cascade connection, the NMOSs 11 and the NMOSs 12 may be alternately arranged in the X-direction, as illustrated in FIG. 26. For the sake of convenience, FIG. 26 illustrates the wiring 151 of the metal wiring layer M1 electrically connected to the VDD wiring 152, as a wiring $151_D$ (M1), and illustrates the wiring 151 of the metal wiring layer M1 electrically connected to the VSS wiring 153, as a wiring $151_S$ (M1).

In the example illustrated in FIG. 26, the distance W2 or W3 at the first part between the guard ring 117 under the VSS wiring 153 and the impurity region 111 of the NMOS 11, is shorter than the distance W1 at the second part, other than the first part, between the guard ring 117 and the impurity region of the NMOS 11, similarly as in the case of the embodiments and the modifications described above.

Hence, similarly as in the case of the embodiments and the modifications described above, the ESD current more easily flows through the part having the distance W2 or W3 and the low resistance, than the part having the distance W1 and the high resistance. As a result, it is possible to reduce the ESD current flowing through the wiring 154 on the guard ring 217, to thereby reduce the EM from being generated in the wiring 154 due to the ESD current.

In addition, the density of the vias V0 located at the positions overlapping the VSS wiring 153 in a plan view, along the direction in which the guard ring 117 extends, may be higher than the density of the vias V0 located at positions separated from and not overlapping the VSS wiring 153 in a plan view, along the direction in which the guard ring 117 extends. In this case, it is possible to cause the ESD current to more easily flow to the guard ring 117 under the VSS wiring 153. Hence, it is possible to further reduce the EM from being generated in the wiring 154 due to the ESD current.

The distance between the guard ring 117 and the NMOS 11 may be increased in steps as the distance from the VSS wiring 153 increases. By employing such an arrangement, it is possible to increase the number of NMOSs inside the guard ring 117 while obtaining the effect of reducing the EM. As a result, it is possible to improve the performance of the semiconductor device 1, such as the driving capability of the semiconductor device 1, the protection capability against the ESD surge with respect to the protected circuit, or the like, for example.

The fourth embodiment may use, for the NMOSs 11 and 12, the various types of FETs described in conjunction with the first and second modifications of the first embodiment, such as the Fin FETs and the nanowire FETs. The fourth embodiment may modify the arrangement of the circuit, or modify the alignment of the FETs, similarly as in the case of the third modification of the first embodiment. Further, the fourth embodiment may have the hammer type structure in which the NMOS 11 located at the position separated from the VDD wiring 152 is arranged close to the guard ring 117, similarly as in the case of the second embodiment.

Although the description above relates to the case in which the circuit illustrated in FIG. 20 is arranged inside the guard ring 117, the circuit illustrated in FIG. 24, for example, may be arranged in a similar matter inside the guard ring 117. In this circuit illustrated in FIG. 24, the NMOSs 11 and 12 may be connected between the ground terminal VSS and the input and output pad 311 in a cascade connection, and arranged similarly as in FIG. 26.

In addition, in the circuit illustrated in FIG. 24, the PMOSs 21 and 22 may be connected between the power supply terminal VDD and the input and output pad 311 in a cascade connection, and arranged similarly as in FIG. 26. However, in the case of the PMOSs 21 and 22, the impurity regions 211 and 212, and the gate electrode 213 of the PMOSs 21 are surrounded by the guard ring 217 that is formed by the N-type impurity region, and the guard ring 217 is connected to the VDD wiring 152 through the wiring 154 of the metal wiring layer M1 that is arranged on the guard ring 217.

According to the embodiments and modifications described above, it is possible to provide a semiconductor device provided with an ESD protection circuit and capable of reducing generation of EM.

Further, the present invention is not limited to these embodiments, but various variations, modifications, and substitutions may be made without departing from the scope of the present invention.

Each of the embodiments and modifications may be appropriately combined, if required.

Although the embodiments are numbered with, for example, "first," "second," "third," or "fourth," the ordinal numbers do not imply priorities of the embodiments. Similarly, the ordinal numbers of the modifications do not imply priorities of the modifications. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
   a substrate;
   a first transistor which includes a first impurity region of a first conductivity type formed in the substrate, and which includes a second impurity region of the first conductivity type formed in the substrate;
   a first guard ring of a second conductivity type different from the first conductivity type, formed in the substrate, the first guard ring surrounding the first transistor in a plan view;
   a first wiring formed on the first guard ring and electrically connected to the first guard ring; and
   a ground wiring formed on the first wiring, the ground wiring being electrically connected to the first wiring and the second impurity region,
   wherein
   the first transistor includes a first part and a second part which are respectively arranged in a first direction in a plan view,
   the first part of the first transistor is separated with a first distance from the first guard ring in a second direction which is perpendicular to the first direction in a plan view,
   the second part of the first transistor is separated with a second distance from the first guard ring in the second direction in a plan view,
   the second distance is shorter than the first distance,
   the first part is separated from the ground wiring in a plan view, and
   the second part is overlapped with the ground wiring in a plan view.

2. The semiconductor device as claimed in claim 1, further comprising:
   a power supply wiring,
   wherein the first impurity region is electrically connected to the power supply wiring.

3. The semiconductor device as claimed in claim 1, further comprising:
   a plurality of first vias connecting the first guard ring and the first wiring,
   wherein a density of the plurality of first vias which are overlapped with the ground wiring in a plan view, along a direction in which the first guard ring extends, is higher than a density of the plurality of first vias which are separated from and not overlapped with the ground wiring in a plan view, along the direction in which the first guard ring extends.

4. The semiconductor device as claimed in claim 1, wherein
   the first transistor includes a third part,
   the third part is separated with a third distance from the first guard ring in a plan view,
   the third distance is shorter than the first distance, and
   the second part is positioned between the first part and the third part in a plan view.

5. The semiconductor device as claimed in claim 1, wherein distance between the first transistor and the first guard ring increases in steps between the first part and the second part in a plan view.

6. The semiconductor device as claimed in claim 1, wherein the first transistor is a Fin FET (Field-Effect-Transistor) or a nanowire FET.

7. A semiconductor device comprising:
   a substrate;
   a first transistor, which includes a first impurity region of a first conductivity type formed in the substrate, and which includes a second impurity region of the first conductivity type formed in the substrate;
   a first guard ring of a second conductivity type different from the first conductivity type, formed in the substrate, the first guard ring surrounding the first transistor in a plan view;
   a first wiring formed on the first guard ring and electrically connected to the first guard ring; and
   a power supply wiring formed on the first wiring, the power supply wiring being electrically connected to the first wiring and the first impurity region,
   wherein
   the first transistor includes a first part and a second part which are respectively arranged in a first direction in a plan view,
   the first part of the first transistor is separated with a first distance from the first guard ring in a second direction which is perpendicular to the first direction in a plan view,
   the second part of the first transistor is separated with a second distance from the first guard ring in the second direction in a plan view,
   the second distance is shorter than the first distance,
   the first part is separated from the power supply wiring in a plan view, and
   the second part is overlapped with the power supply wiring in a plan view.

8. The semiconductor device as claimed in claim 7, further comprising:
   a plurality of first vias connecting the first guard ring and the first wiring,
   wherein a density of the plurality of first vias which are overlapped with the power supply wiring in a plan view, along a direction in which the first guard ring extends, is higher than a density of the plurality of first vias which are separated from and not overlapped with the power supply wiring in a plan view, along the direction in which the first guard ring extends.

9. The semiconductor device as claimed in claim 7, wherein
   the first transistor includes a third part,
   the third part is separated with a third distance from the first guard ring in a plan view, and
   the second part is positioned between the first part and the third part.

10. The semiconductor device as claimed in claim 7, wherein distance between the first transistor and the first guard ring increases in steps between the first part and the second part in a plan view.

11. The semiconductor device as claimed in claim 7, wherein the first transistor is a Fin FET (Field-Effect-Transistor) or a nanowire FET.

12. A semiconductor device comprising:
a substrate;
a first transistor which includes a first impurity region of a first conductivity type formed in the substrate, and which includes a second impurity region of the first conductivity type formed in the substrate;
a first guard ring of a second conductivity type different from the first conductivity type, formed in the substrate, the first guard ring surrounding the first transistor in a plan view;
a first wiring formed on the first guard ring and electrically connected to the first guard ring;
a ground wiring formed on the first wiring, the ground wiring being electrically connected to the first wiring and the second impurity region;
a second transistor, which includes a third impurity region of the second conductivity type formed in the substrate, and which includes a fourth impurity region of the second conductivity type formed in the substrate;
a second guard ring of the first conductivity type formed in the substrate, the second guard ring surrounding the second transistor in a plan view;
a second wiring formed on the second guard ring and electrically connected to the second guard ring; and
a power supply wiring formed on the second wiring, the power supply wiring being electrically connected to the second wiring and the third impurity region,
wherein
the first transistor includes a first part and a second part,
the first part of the first transistor is separated with a first distance from the first guard ring in a plan view,
the second part of the first transistor is separated with a second distance from the first guard ring in a plan view,
the second distance is shorter than the first distance,
the first part is separated from the ground wiring in a plan view,
the second part is overlapped with the ground wiring in a plan view,
the second transistor includes a third part and a fourth part,
the third part of the second transistor is separated with a third distance from the second guard ring in a plan view,
the fourth part of the second transistor is separated with a fourth distance from the second guard ring in a plan view,
the fourth distance is shorter than the third distance,
the third part is separated from the power supply wiring in a plan view, and
the fourth part is overlapped with the power supply wiring in a plan view.

13. The semiconductor device as claimed in claim 12, further comprising:
a plurality of first vias connecting the first guard ring and the first wiring,
wherein a density of the plurality of first vias which are overlapped with the ground wiring in a plan view, along a direction in which the first guard ring extends, is higher than a density of the plurality of first vias which are separated from and not overlapped with the ground wiring in a plan view, along the direction in which the first guard ring extends.

14. The semiconductor device as claimed in claim 12, further comprising:
a plurality of second vias connecting the second guard ring and the second wiring,
wherein a density of the plurality of second vias which are overlapped with the power supply wiring in a plan view, along a direction in which the second guard ring extends, is higher than a density of the plurality of second vias which are separated from and not overlapped with the power supply wiring in a plan view, along the direction in which the second guard ring extends.

15. The semiconductor device as claimed in claim 12, further comprising:
a plurality of first vias connecting the first guard ring and the first wiring; and
a plurality of second vias connecting the second guard ring and the second wiring,
wherein a density of the plurality of first vias which are overlapped with the ground wiring in a plan view, along a direction in which the first guard ring extends, is higher than a density of the plurality of first vias which are separated from and not overlapped with the ground wiring in a plan view, along the direction in which the first guard ring extends, and
wherein a density of the plurality of second vias which are overlapped with the power supply wiring in a plan view, along a direction in which the second guard ring extends, is higher than a density of the plurality of second vias which are separated from and not overlapped with the power supply wiring in a plan view, along the direction in which the second guard ring extends.

16. The semiconductor device as claimed in claim 12, further comprising:
an input and output terminal connected to the first impurity region and the fourth impurity region.

17. The semiconductor device as claimed in claim 12, wherein
the first transistor includes a fifth part,
the fifth part is separated with a third distance from the first guard ring in a plan view,
the third distance is shorter than the first distance, and
the second part is positioned between the first part and the fifth part in a plan view.

18. The semiconductor device as claimed in claim 12, wherein
distance between the first transistor and the first guard ring increases in steps between the first part and the second part in a plan view, and
distance between the second transistor and the second guard ring increases in steps between the third part and the fourth part in a plan view.

19. The semiconductor device as claimed in claim 12, wherein
the second transistor includes a sixth part,
the sixth part is separated with a sixth distance from the second guard ring in a plan view, and
the fourth part is positioned between the third part and the sixth part.

20. The semiconductor device as claimed in claim 12, wherein at least one of the first transistor and the second transistor is a Fin FET (Field-Effect-Transistor) or a nanowire FET.

* * * * *